United States Patent
Yoneda et al.

(10) Patent No.: US 9,680,093 B2
(45) Date of Patent: *Jun. 13, 2017

(54) NONVOLATILE MEMORY ELEMENT, NONVOLATILE MEMORY DEVICE, NONVOLATILE MEMORY ELEMENT MANUFACTURING METHOD, AND NONVOLATILE MEMORY DEVICE MANUFACTURING METHOD

(75) Inventors: Shinichi Yoneda, Kyoto (JP); Takumi Mikawa, Shiga (JP); Satoru Ito, Hyogo (JP); Yukio Hayakawa, Kyoto (JP); Atsushi Himeno, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/343,441

(22) PCT Filed: Sep. 10, 2012

(86) PCT No.: PCT/JP2012/005727
§ 371 (c)(1),
(2), (4) Date: Mar. 7, 2014

(87) PCT Pub. No.: WO2013/038647
PCT Pub. Date: Mar. 21, 2013

(65) Prior Publication Data
US 2014/0197368 A1    Jul. 17, 2014

(30) Foreign Application Priority Data
Sep. 16, 2011  (JP) .................................. 2011-203804

(51) Int. Cl.
*H01L 45/00*   (2006.01)
*H01L 27/24*   (2006.01)

(52) U.S. Cl.
CPC ............ *H01L 45/124* (2013.01); *H01L 45/08* (2013.01); *H01L 45/1233* (2013.01);
(Continued)

(58) Field of Classification Search
CPC . H01L 45/124; H01L 45/1246; H01L 45/145; H01L 45/1608; H01L 45/1625;
(Continued)

(56) References Cited

U.S. PATENT DOCUMENTS

| 7,915,656 | B2 | 3/2011 | Mikawa et al. |
| 8,022,502 | B2 | 9/2011 | Kanzawa et al. |

(Continued)

FOREIGN PATENT DOCUMENTS

| JP | 2010-251352 | 11/2010 |
| JP | 2010-287683 | 12/2010 |

(Continued)

OTHER PUBLICATIONS

International Search Report issued Oct. 16, 2012 in International Application No. PCT/JP2012/005727.

*Primary Examiner* — A. Sefer
*Assistant Examiner* — Vincent Wall
(74) *Attorney, Agent, or Firm* — Wenderoth, Lind & Ponack, L.L.P.

(57) ABSTRACT

A nonvolatile memory element including: a first electrode; a second electrode; a variable resistance layer that is between the first electrode and the second electrode and includes, as stacked layers, a first variable resistance layer connected to the first electrode and a second variable resistance layer connected to the second electrode; and a side wall protecting layer that has oxygen barrier properties and covers a side surface of the variable resistance layer. The first variable resistance layer includes a first metal oxide and a third metal oxide formed around the first metal oxide and having an (Continued)

oxygen deficiency lower than that of the first metal oxide, and the second variable resistance layer includes a second metal oxide having an oxygen deficiency lower than that of the first metal oxide.

9 Claims, 20 Drawing Sheets

(52) U.S. Cl.
CPC ........ H01L 45/1246 (2013.01); H01L 45/145 (2013.01); H01L 45/146 (2013.01); H01L 45/1608 (2013.01); H01L 45/1625 (2013.01); H01L 45/1675 (2013.01); H01L 27/2409 (2013.01); H01L 27/2436 (2013.01); H01L 27/2481 (2013.01)

(58) Field of Classification Search
CPC ... H01L 45/08; H01L 45/146; H01L 45/1675; H01L 45/1233
See application file for complete search history.

(56) References Cited

U.S. PATENT DOCUMENTS

| | | | |
|---|---|---|---|
| 8,058,636 B2 | 11/2011 | Osano et al. | |
| 8,089,796 B2 | 1/2012 | Tsukamoto et al. | |
| 8,217,489 B2 | 7/2012 | Osano et al. | |
| 8,373,149 B2 | 2/2013 | Takahashi | |
| 8,437,173 B2* | 5/2013 | Hayakawa | G11C 13/0007 257/3 |
| 8,441,837 B2 | 5/2013 | Ikeda et al. | |
| 8,445,319 B2 | 5/2013 | Kanazawa et al. | |
| 8,481,990 B2* | 7/2013 | Kawashima | H01L 27/2436 257/2 |
| 8,492,875 B2 | 7/2013 | Osano et al. | |
| 8,508,976 B2 | 8/2013 | Katayama et al. | |
| 8,569,728 B2 | 10/2013 | Takano et al. | |
| 8,618,526 B2* | 12/2013 | Sorada | H01L 27/101 257/4 |
| 9,159,917 B2* | 10/2015 | Yoneda | H01L 45/145 |
| 2009/0250678 A1 | 10/2009 | Osano et al. | |
| 2009/0283736 A1 | 11/2009 | Kanzawa et al. | |
| 2010/0051892 A1 | 3/2010 | Mikawa et al. | |
| 2010/0059730 A1* | 3/2010 | Ito | H01L 27/101 257/2 |
| 2010/0314602 A1* | 12/2010 | Takano et al. | 257/4 |
| 2011/0001110 A1* | 1/2011 | Takahashi | 257/2 |
| 2011/0026294 A1 | 2/2011 | Tsukamoto et al. | |
| 2011/0034113 A1 | 2/2011 | Kazahaya et al. | |
| 2011/0103131 A1 | 5/2011 | Katayama et al. | |
| 2011/0122680 A1 | 5/2011 | Ikeda et al. | |
| 2011/0294259 A1 | 12/2011 | Kanzawa et al. | |
| 2012/0063201 A1 | 3/2012 | Hayakawa et al. | |
| 2012/0074369 A1 | 3/2012 | Osano et al. | |
| 2012/0235111 A1 | 9/2012 | Osano et al. | |
| 2013/0010529 A1* | 1/2013 | Hayakawa | H01L 27/101 365/148 |
| 2014/0021430 A1 | 1/2014 | Takano et al. | |

FOREIGN PATENT DOCUMENTS

| | | | |
|---|---|---|---|
| JP | 4628500 | 2/2011 | |
| JP | 4643767 | 3/2011 | |
| JP | 2011-71380 | 4/2011 | |
| JP | WO 2012070238 A1 * | 5/2012 | ........... H01L 27/101 |
| WO | 2008/050716 | 5/2008 | |
| WO | 2008/126365 | 10/2008 | |
| WO | 2008/149484 | 12/2008 | |
| WO | 2009/122569 | 10/2009 | |
| WO | 2009/125777 | 10/2009 | |
| WO | 2009/125780 | 10/2009 | |
| WO | 2010/119671 | 10/2010 | |
| WO | 2010/125780 | 11/2010 | |

* cited by examiner

NONVOLATILE MEMORY ELEMENT, NONVOLATILE MEMORY DEVICE, NONVOLATILE MEMORY ELEMENT MANUFACTURING METHOD, AND NONVOLATILE MEMORY DEVICE MANUFACTURING METHOD

TECHNICAL FIELD

The present invention relates to a variable resistance nonvolatile memory element of which a resistance value changes with an application of electric pulses, and to a nonvolatile memory device including the variable resistance nonvolatile memory element.

BACKGROUND ART

In recent years, along with development of the digital technology, electronic devices such as portable information devices and information home appliances have increasingly higher-level functionalities. There is thus a higher demand on nonvolatile memory elements for an increase in capacity, a reduction in power for writing, an increase in speed for writing/reading, and a longer operating life.

In response to such a demand, it is said that there is a limit on the miniaturization of existing flash memories using floating gates. On the other hand, a nonvolatile memory element (i.e., a variable resistance memory) using a variable resistance layer as a material of a memory unit can be composed of a simple-structured memory device represented by a nonvolatile memory element, which therefore lays high expectations for further miniaturization, increase in speed, and reduction in power consumption.

The variable resistance layer which is used as a material of the memory unit will have resistance changing in value from high resistance to low resistance or from low resistance to high resistance by input of electric pulses or the like, for example. In this case, it is necessary that two values of low resistance and high resistance be clearly distinguished, a change between low resistance and high resistance be stable at high speed, and these two values be held in a nonvolatile manner. Various proposals have been hitherto made with the view of such stability of memory characteristics and miniaturization of memory elements.

As an example of this nonvolatile memory element, a nonvolatile memory device using stacked transition metal oxides with different oxygen deficiencies for the variable resistance layer has been proposed. For instance, Patent Literature (PTL) 1 discloses a change in resistance is stabilized by selectively causing an oxidation-reduction reaction at an electrode interface in contact with a variable resistance layer with a low oxygen deficiency.

Each of these conventional nonvolatile memory elements includes a lower electrode, a variable resistance layer, and an upper electrode. The nonvolatile memory elements are arranged two- or three-dimensionally to form a memory cell array. In each nonvolatile memory element, the variable resistance layer has a laminated structure of a first variable resistance layer and a second variable resistance layer that comprise the same transition metal oxide. The transition metal oxide included in the second variable resistance layer has an oxygen deficiency lower than that of the transition metal oxide included in the first variable resistance layer.

With such a structure, applying voltage to a nonvolatile memory element will result in the majority of the voltage being applied to the second variable resistance layer having a lower oxygen deficiency and a higher resistance value. Moreover, oxygen capable of contributing to the reaction is abundant in the vicinity of the interface between the second variable resistance layer and the upper electrode. Thus, the oxidation-reduction reaction selectively occurs at the interface between the second variable resistance layer and the upper electrode, which allows the resistance to change stably.

CITATION LIST

Patent Literature

[PTL 1]
International Application Publication No. WO 2008/149484
[PTL 2]
International Application Publication No. WO 2008/126365

SUMMARY OF INVENTION

Technical Problem

The conventional nonvolatile memory element, however, needs a process referred to as initial breakdown, to change from the initial state immediately after manufacturing to an operation state in which resistance change occurs stably. The initial breakdown refers to a process for locally short-circuiting part of a variable resistance layer having a low oxygen deficiency by applying, to a nonvolatile memory element in the initial state, voltage higher in amplitude than voltage causing the nonvolatile memory element to change resistance in the operation state. The voltage applied to the nonvolatile memory element in the initial breakdown process is referred to as an initial breakdown voltage.

In a nonvolatile memory element needing the initial breakdown process, it is demanded that the initial breakdown can be achieved by applying as low voltage as possible, to reduce a possibility that unintentional electrical breakdown occurs in the nonvolatile memory element in the initial breakdown process, and to perform the initial breakdown process efficiently.

Moreover, it is also simultaneously demanded that nonvolatile memory elements provided in a nonvolatile memory device have resistance change characteristics that are satisfactory and uniform (i.e., a fluctuation is small) in terms of the controllability and stability of operation of the nonvolatile memory device.

The conventional nonvolatile memory device, however, still has room for improvement in these demands.

The present invention has been conceived in response to the demands, and an object of the present invention is to provide a nonvolatile memory element that makes it possible to reduce an initial breakdown voltage and stabilize resistance change characteristics, and a nonvolatile memory device using such a nonvolatile memory element.

Solution to Problem

In order to solve the above problem, a nonvolatile memory element according to an aspect of the present invention includes: a first electrode; a second electrode; a variable resistance layer that is between the first electrode and the second electrode and includes, as stacked layers, a first variable resistance layer connected to the first electrode and a second variable resistance layer connected to the second electrode, the variable resistance layer having a resistance value that reversibly changes based on an electrical signal applied between the first electrode and the second electrode; a side wall protecting layer that has oxygen barrier properties and covers a side surface of the variable resistance layer which is connected to neither the first electrode nor the second electrode; and an interlayer insulating layer formed to cover the variable resistance layer and the side wall protecting layer, wherein the first variable resistance layer comprises a first metal oxide and a third metal oxide formed around the first metal oxide and having an oxygen deficiency lower than an oxygen deficiency of the first metal oxide, and the second variable resistance layer comprises a second metal oxide having an oxygen deficiency lower than the oxygen deficiency of the first metal oxide, and the side wall protecting layer covers at least a side surface of the third metal oxide to prevent oxygen in the interlayer insulating layer from diffusing into the third metal oxide.

Advantageous Effects of Invention

The nonvolatile memory element according to the aspect of the present invention allows the third metal oxide to decrease the maximum area of the second metal oxide in a planar direction, that is, a direction crossing a direction of drive current flowing to the nonvolatile memory element, to reduce leak current of the variable resistance layer and increase a density of current flowing to the first metal oxide. This makes it possible to easily form a conductive path in the first metal oxide and reduce the initial breakdown voltage, and thus it is possible to initialize the element at low voltage.

At the same time, by covering the side walls of the third metal oxide with the side wall protecting layer, it is possible to suppress a deterioration and increasing fluctuation in resistance characteristics of the nonvolatile memory element which are caused by supply of oxygen to the third metal oxide and further oxidation of the third metal oxide due to a deposition step and a heat treatment step for an interlayer insulating layer in a manufacturing process after formation of the nonvolatile memory element, or by an increasing fluctuation in an oxidation layer including the third metal oxide.

These features significantly contribute to particularly the miniaturization and the increase in capacity of memories.

DESCRIPTION OF EMBODIMENTS

Characteristics and a problem of a nonvolatile memory device according to a related invention of the present invention are described here before describing embodiments of the present invention. The related invention is conceived by the inventors of the present invention with the view to reduce an initial breakdown voltage and suppress a variation in initial breakdown voltage, and is disclosed in Patent Literature (PTL) 3: International Publication WO 2011/114725.

Figure 20:
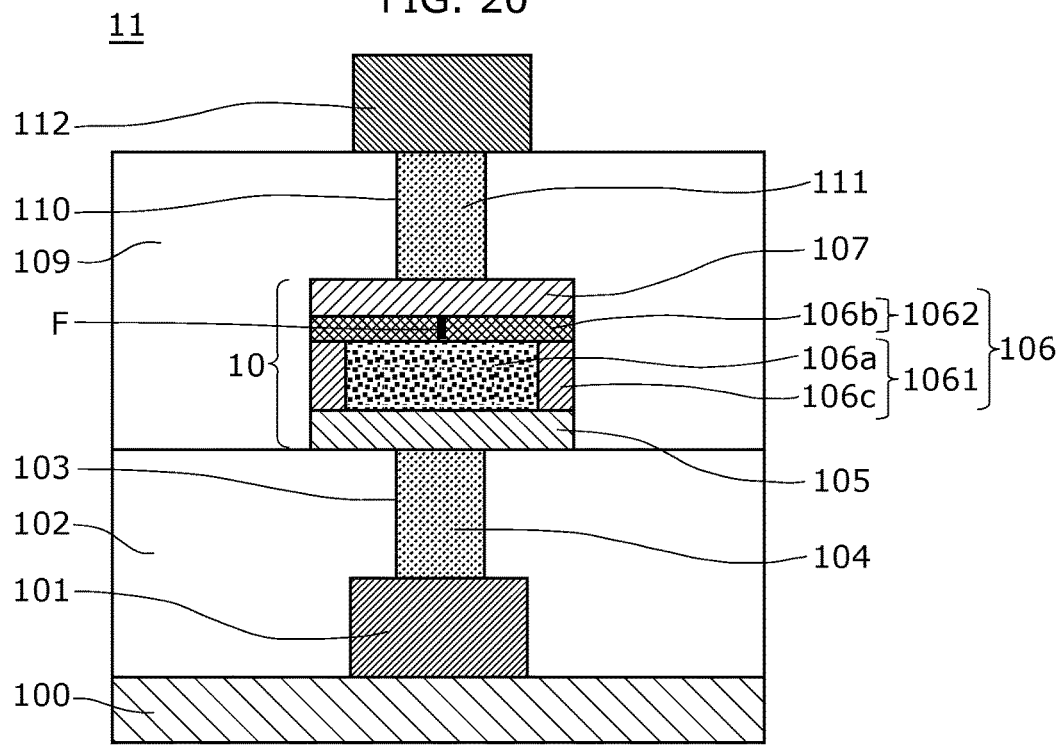
FIG. 20 is a cross-sectional view illustrating an exemplary structure of a nonvolatile memory device according to a related invention.

FIG. 20 is a cross-sectional view illustrating a structure of a nonvolatile memory device 11 including a nonvolatile memory element 10 according to the related invention.

FIGS. 21A to 21I each are a cross-sectional view illustrating a method for manufacturing principal parts of the nonvolatile memory device 11 according to the related invention.

Figure 21A:
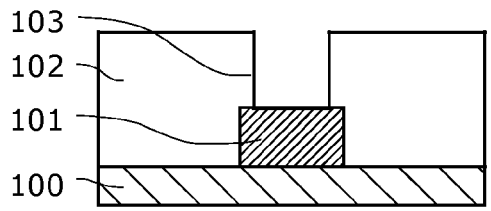
FIG. 21A is a cross-sectional view illustrating a method for manufacturing principal parts of the nonvolatile memory device according to the related invention.

As illustrated in FIG. 21A, a conductive layer comprising aluminum is formed on a substrate 100 in which a transistor, a lower-layer line, and so on are formed, and this conductive layer is patterned to form a first line 101. Furthermore, an insulating film is formed on the substrate 100 so as to cover the first line 101, and then the surface of the insulating film is planarized to form an interlayer insulating layer 102. Then, the interlayer insulating layer 102 is patterned using a desired mask, to form a contact hole 103 which penetrates the interlayer insulating layer 102 and extends to the first line 101.

Figure 21B:
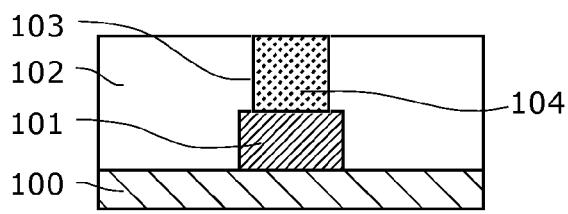
FIG. 21B is a cross-sectional view illustrating the method for manufacturing principal parts of the nonvolatile memory device according to the related invention.

Next, as illustrated in FIG. 21B, a contact plug 104 is formed in the contact hole 103 by first using a filler material including tungsten as a main component to fill the contact hole 103, planarizing and polishing an entire surface of a wafer using a chemical mechanical polishing (CMP) method, and removing an unnecessary filler material on the interlayer insulating layer 102.

Figure 21C:
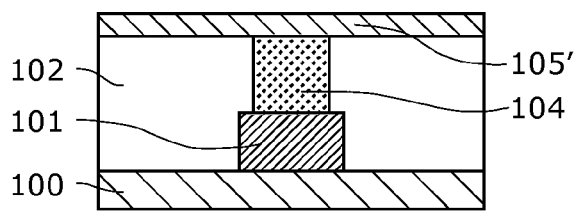
FIG. 21C is a cross-sectional view illustrating the method for manufacturing principal parts of the nonvolatile memory device according to the related invention.

Next, as illustrated in FIG. 21C, a tantalum nitride 105' to be eventually a first electrode 105 is disposed as a film on the interlayer insulating layer 102 using a sputtering method, to cover the contact plug 104.

Figure 21D:
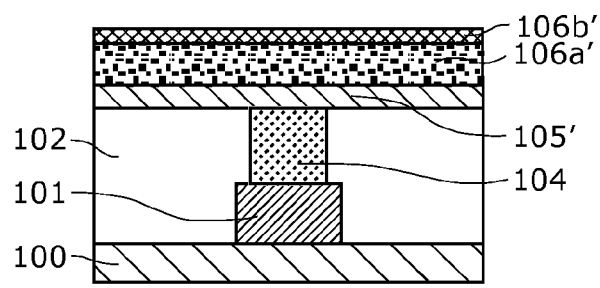
FIG. 21D is a cross-sectional view illustrating the method for manufacturing principal parts of the nonvolatile memory device according to the related invention.

Next, as illustrated in FIG. 21D, a first metal oxide 106a' that is oxygen-deficient and a second metal oxide 106b' that has a lower oxygen deficiency than the first metal oxide 106a' are stacked in this order on the tantalum nitride 105' and disposed as a film.

An oxygen-deficient metal oxide refers to a metal oxide that is deficient in oxygen relative to a metal oxide having a stoichiometric composition. Here, an oxygen deficiency of a metal oxide is defined as a rate of deficient oxygen to an amount of oxygen included in the metal oxide having the stoichiometric composition. The oxygen deficiency will be described in more detail later.

The first metal oxide 106a' has an oxygen content atomic percentage of 50 to 65 atm %, a resistivity of 2 to 50 mΩ·cm, and a film thickness of 20 to 100 nm, and the second metal oxide 106b' has an oxygen content atomic percentage of 65 to 75 atm %, a resistivity of at least $10^7$ mΩ·cm, and a film thickness of 3 to 10 nm.

Figure 21E:
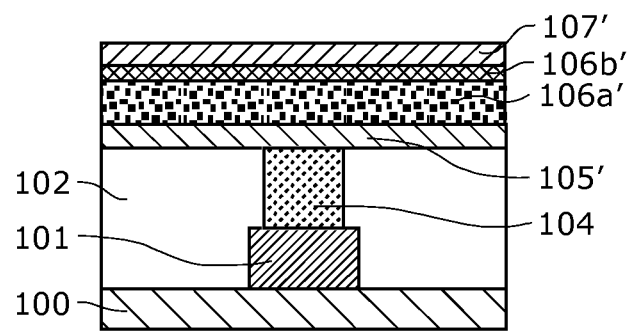
FIG. 21E is a cross-sectional view illustrating the method for manufacturing principal parts of the nonvolatile memory device according to the related invention.

Next, as illustrated in FIG. 21E, a noble metal (e.g., platinum, iridium, and palladium) layer 107' to be eventually a second electrode 107 after patterning is disposed as a film on the second metal oxide 106b'.

Figure 21F:
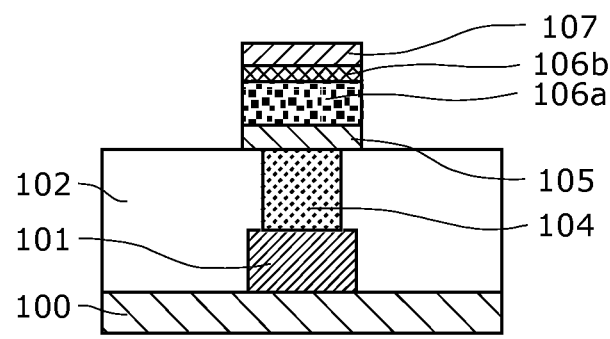
FIG. 21F is a cross-sectional view illustrating the method for manufacturing principal parts of the nonvolatile memory device according to the related invention.

Next, as illustrated in FIG. 21F, a stacked film including, as layers, the noble metal layer 107', the second metal oxide 106b', the first metal oxide 106a', and the tantalum nitride 105' is patterned into a nonvolatile memory element.

Figure 21G:
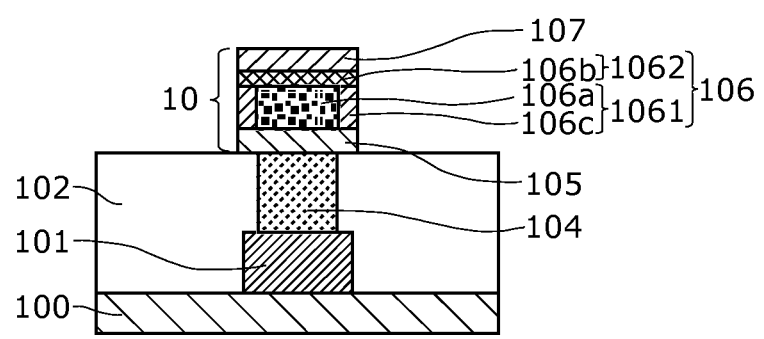
FIG. 21G is a cross-sectional view illustrating the method for manufacturing principal parts of the nonvolatile memory device according to the related invention.

Next, as illustrated in FIG. 21G, a third metal oxide 106c, an insulating region, is formed by oxidizing the sides of the first metal oxide 106a by annealing the patterned stacked film in an oxygen atmosphere. Since the second metal oxide 106b is practically an insulator, the second metal oxide 106b is not oxidized in this step.

Through these steps, a first variable resistance layer 1061 of which neighboring portions of the sides are oxidized and a second variable resistance layer 1062 constitute a variable resistance layer 106, and the first electrode 105, the variable resistance layer 106, and the second electrode 107 constitute the nonvolatile memory element 10.

Figure 21H:
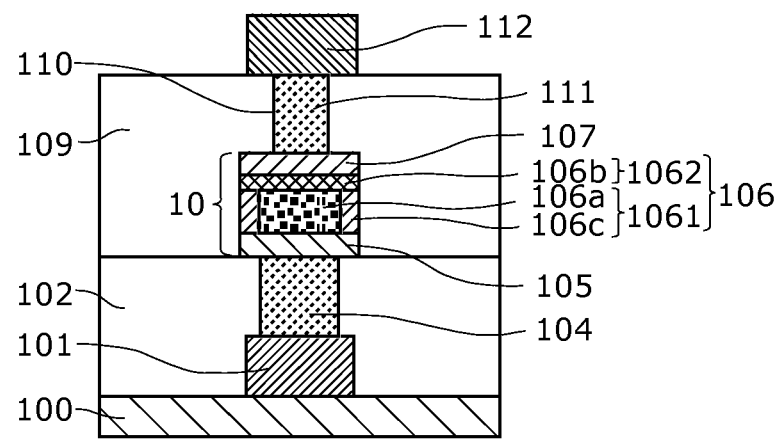
FIG. 21H is a cross-sectional view illustrating the method for manufacturing principal parts of the nonvolatile memory device according to the related invention.

Next, as illustrated in FIG. 21H, a second interlayer insulating layer 109 having a thickness of 500 to 1000 nm is formed to cover the variable resistance layer 106, and a second contact hole 110 and a second contact plug 111 are formed by the same manufacturing method as in FIG. 21A and FIG. 21B. Then, a second line 112 is formed to cover the second contact plug 111.

Figure 21I:
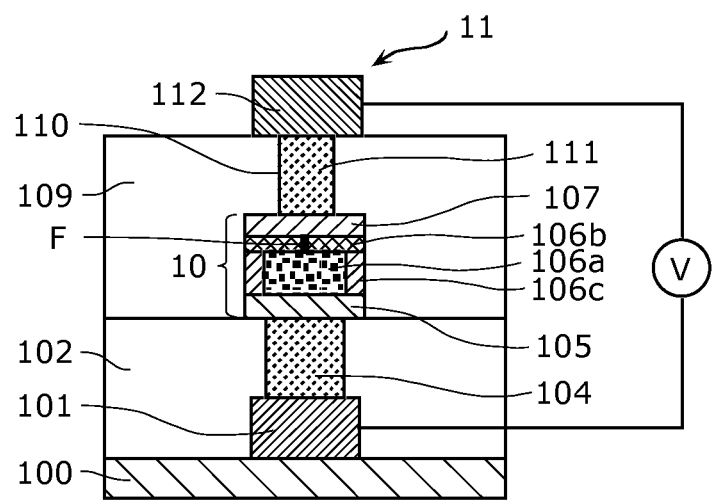
FIG. 21I is a cross-sectional view illustrating the method for manufacturing principal parts of the nonvolatile memory device according to the related invention.

Lastly, as illustrated in FIG. 21I, a tiny localized region F of which an oxygen deficiency reversibly changes in response to an application of electric pulses is formed in the second variable resistance layer 1062 by applying an initial breakdown voltage to the nonvolatile memory element 10 via the first line 101 and the second line 112, and the nonvolatile memory device 11 is completed. The localized region presumably includes a filament including an oxygen defect site.

With the above manufacturing method, by oxidizing and insulating the side wall portions of the nonvolatile memory element 10, it is possible to decrease an active area to which current contributing to resistance change operation flows, reduce leak current, and achieve a reduction in initial breakdown voltage and application time of an initial breakdown voltage.

Unfortunately, the nonvolatile memory device 11 has a problem that oxygen is supplied to the third metal oxide 106c, and the third metal oxide 106c is further oxidized to increase the fluctuation due to a deposition step and a heat treatment step for the second interlayer insulating layer 109 in the manufacturing process after the formation of the nonvolatile memory element 10, which leads to a deterioration and the increasing fluctuation in resistance change characteristics of the nonvolatile memory element 10.

The present invention is conceived to solve such a problem.

In order to solve the problem, a nonvolatile memory element according to an aspect of the present invention includes: a first electrode; a second electrode; a variable resistance layer that is between the first electrode and the second electrode and includes, as stacked layers, a first variable resistance layer connected to the first electrode and a second variable resistance layer connected to the second electrode, the variable resistance layer having a resistance value that reversibly changes based on an electrical signal applied between the first electrode and the second electrode; and a side wall protecting layer that has oxygen barrier properties and covers a side surface of the variable resistance layer which is connected to neither the first electrode nor the second electrode, wherein the first variable resistance layer comprises a first metal oxide and a third metal oxide formed around the first metal oxide and having an oxygen deficiency lower than an oxygen deficiency of the first metal oxide, and the second variable resistance layer comprises a second metal oxide having an oxygen deficiency lower than the oxygen deficiency of the first metal oxide.

Moreover, a nonvolatile memory element according to another aspect of the present invention may include: a first electrode; a second electrode; a variable resistance layer that is between the first electrode and the second electrode and includes, as stacked layers, a first variable resistance layer connected to the first electrode and a second variable resistance layer connected to the second electrode, the variable resistance layer having a resistance value that reversibly changes based on an electrical signal applied between the first electrode and the second electrode; and a side wall protecting layer that has oxygen barrier properties and covers a side surface of the variable resistance layer which is connected to neither the first electrode nor the second electrode, wherein the first variable resistance layer comprises a first metal oxide and a third metal oxide formed around the first metal oxide and having an oxygen content atomic percentage higher than an oxygen content atomic percentage of the first metal oxide, and the second variable resistance layer comprises a second metal oxide having an oxygen content atomic percentage higher than the oxygen content atomic percentage of the first metal oxide.

Furthermore, the side wall protecting layer may further cover a side surface of the first electrode and a side surface and a top surface of the second electrode.

Moreover, the side wall protecting layer may cover at least a side surface of the third metal oxide.

Furthermore, the side wall protecting layer may comprise one of a metal oxide, a metal nitride, and a metal acid nitride that have insulation properties and oxygen barrier properties.

Moreover, the side wall protecting layer may comprise one of a silicon nitride, an aluminum oxide, and a titanium oxide.

With these configurations, the third metal oxide is allowed to decrease the maximum area of the second metal oxide in a planar direction, that is, a direction crossing a direction of drive current flowing to the nonvolatile memory element, to reduce leak current of the variable resistance layer and increase a density of current flowing to the first metal oxide. This makes it possible to easily form a conductive path in the first metal oxide and reduce the initial breakdown voltage, and thus it is possible to initialize the element at low voltage. At the same time, by covering the side walls of the third metal oxide with the side wall protecting layer, it is possible to suppress a deterioration and increasing fluctuation in resistance characteristics of the nonvolatile memory element which are caused by supply of oxygen to the third metal oxide and further oxidation of the third metal oxide due to a deposition step and a heat treatment step for an interlayer insulating layer in a manufacturing process after formation of the nonvolatile memory element, or by an increasing fluctuation in an oxidation layer including the third metal oxide.

Furthermore, the first metal oxide may have a stack structure of a plurality of layers comprising metal oxides having different oxygen deficiencies.

With this configuration, it is possible to enhance endurance characteristics of the nonvolatile memory element.

Moreover, each of the first metal oxide, the second metal oxide, and the third metal oxide may be one of a tantalum oxide, a hafnium oxide, and a zirconium oxide.

With such a configuration, specific composition and film thickness of the first metal oxide, the second metal oxide, and the third metal oxide which allow a resistance change operation to occur stably and at high speed are clarified.

Furthermore, the second variable resistance layer may be provided with a localized region having an oxygen deficiency that reversibly changes in response to an application of an electric pulse.

With such a configuration, it is possible to cause a resistance change phenomenon by inducing oxidation-reduction reaction in the filament to change a resistance value (oxygen deficiency) of the second variable resistance layer.

The present invention can be implemented not only as such a nonvolatile memory element but also as a nonvolatile memory device including the nonvolatile memory element, a nonvolatile memory element manufacturing method, and a nonvolatile memory device manufacturing method.

The following describes embodiments of the present invention in detail with reference to the Drawings. It is to be noted that the same reference signs are assigned to the same or corresponding elements throughout all figures, and descriptions thereof may be omitted.

It is to be noted that each of the embodiments described below shows a general or specific example. The numerical values, shapes, materials, structural elements, the arrangement and connection of the structural elements, steps, the processing order of the steps etc. shown in the following embodiments are mere examples, and therefore do not limit the scope of the present invention. Therefore, among the structural elements in the following embodiments, structural elements not recited in any one of the independent claims are described as arbitrary structural elements.

(Embodiment 1)

[Structure of Nonvolatile Memory Element]

Figure 1:
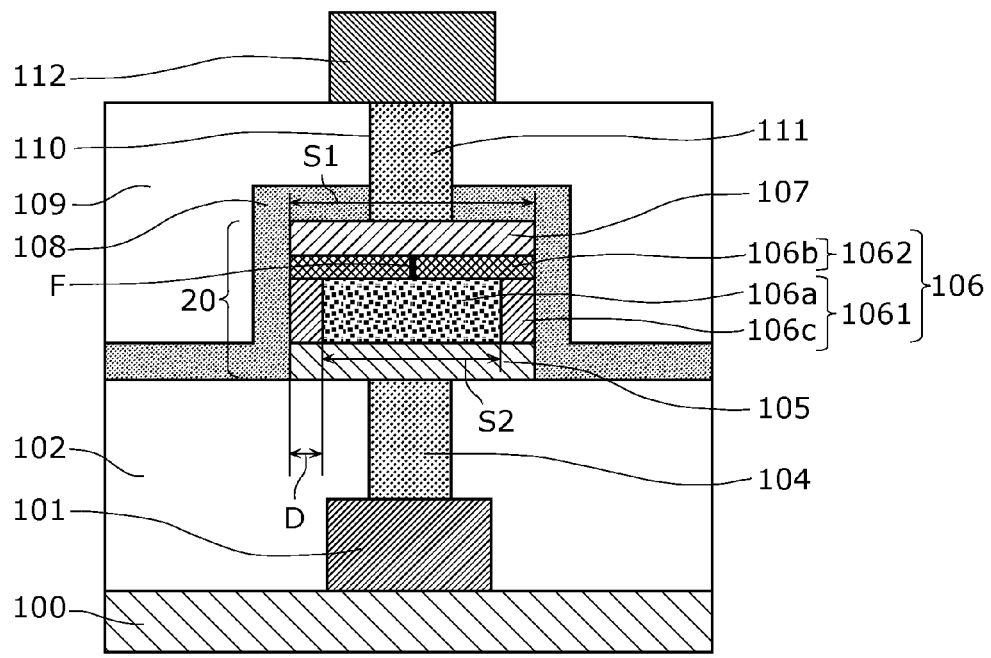
FIG. 1 is a cross-sectional view illustrating an exemplary structure of a nonvolatile memory device according to Embodiment 1 of the present invention.

FIG. 1 is a cross-sectional view illustrating an exemplary structure of a nonvolatile memory device according to Embodiment 1 of the present invention. As illustrated in FIG. 1, a nonvolatile memory device 21 according to this embodiment is a variable resistance nonvolatile memory device and includes: a substrate 100; a first line 101; a first interlayer insulating layer 102; a first contact plug 104; a nonvolatile memory element 20 having a side wall protecting layer 108; a second interlayer insulating layer 109; a second contact plug 111; and a second line 112. A localized region F of which an oxygen deficiency reversibly changes in response to an application of electrical pulses is formed in a second variable resistance layer 1062 of the nonvolatile memory element 20. The localized region presumably includes a filament including an oxygen-deficient site.

In a practical structure of a memory cell using the nonvolatile memory element 20 according to this embodiment, one of the first line 101 and the second line 112 is connected to a switching element (a diode or transistor) which is not shown and is set to be OFF when the memory cell is not selected. The connection between the nonvolatile memory element 20 and the switch element may be achieved by direct connection between the first electrode 105 and the second electrode 107 of the nonvolatile memory element 20 and the switch element not via the first contact plug 104 and the second contact plug 111 or the first line 101 and the second line 112.

The substrate 100 is a semiconductor substrate comprising silicon (Si) or the like. The first line 101 is wiring formed on the substrate 100. The first interlayer insulating layer 102 is an interlayer insulating layer composed of a silicon oxide film or the like having a thickness of 500 to 1000 nm, which covers the first line 101 on the substrate 100. A first contact hole 103 (see FIG. 2A) is a contact hole having a diameter size of 50 to 300 nm through which the contact plug 104 penetrating the first interlayer insulating layer 102 is electrically connected to the first line 101. The contact plug 104 is a conductor containing, as a primary component, tungsten embedded in the first contact hole 103.

The nonvolatile memory element 20 includes: the first electrode 105 having a thickness of 5 to 100 nm and comprising tantalum nitride or the like, formed on the first interlayer insulating layer 102 so as to cover the first contact plug 104; the variable resistance layer 106 having a thickness of 20 to 100 nm; and the second electrode 107 having a thickness of 5 to 100 nm and comprising a noble metal (such as Pt, Ir, or Pd) or the like. The second interlayer insulating layer 109 is an interlayer insulating layer composed of a silicon oxide film or the like having a thickness of 500 to 1000 nm, which covers the nonvolatile memory element 20. The second contact hole 110 is a contact hole having a diameter size of 50 to 300 nm through which the second contact plug 111 penetrating the second interlayer insulating layer 109 is electrically connected to the second electrode 107. The second contact plug 111 is a conductor containing, as a primary component, tungsten embedded in the second contact hole 110. The second line 112 is formed on the second interlayer insulating layer 109 so as to cover the second contact plug 111.

It is sufficient that the nonvolatile memory element 21 according to an implementation of the present invention includes at least the nonvolatile memory element 20, and the other structural elements, the substrate 100, the first line 101, the first interlayer insulating layer 102, the first contact hole 103, the first contact plug 104, the second interlayer insulating layer 109, the second contact hole 110, the second contact plug 111, and the second line 112, are not indispensable.

The variable resistance layer 106 is a layer disposed between the first electrode 105 and the second electrode 107 and has a resistance value that reversibly changes based on electric signals applied between the first electrode 105 and the second electrode 107. For instance, the variable resistance layer 106 reversibly changes between a high resistance state and a low resistance state according to a polarity of voltage applied between the first electrode 105 and the second electrode 107. The variable resistance layer 106 includes, as at least two layers, a first variable resistance layer 1061 connected to the first electrode 105 and the second variable resistance layer 1062 connected to the second electrode 107.

The first variable resistance layer 1061 has a core portion excluding neighboring portions of the sides of the first variable resistance layer 1061 (the center of the first variable resistance layer 1061 excluding the sides and neighboring regions of the sides) and comprising a first metal oxide 106a that is oxygen-deficient, and the sides and the neighboring portions (the periphery of the first variable resistance layer 1061 including the sides and the neighboring regions) comprising a third metal oxide 106c having a lower oxygen deficiency than the first metal oxide 106a. In other words, the first variable resistance layer 1061 comprises: the first metal oxide 106a that is oxygen-deficient; and the third metal oxide 106c that is formed around the first metal oxide 106a and has the lower oxygen deficiency than the first metal oxide 106a.

The third metal oxide 106c is in contact with at least part of the lower surface of the second variable resistance layer 1062, and the first metal oxide 106a is in contact with the remaining part of the lower surface of the second variable resistance layer 1062. The second variable resistance layer 1062 comprises a second metal oxide 106b having a lower oxygen deficiency than the first metal oxide 106a. The first metal oxide 106a, the second metal oxide 106b, and the third metal oxide 106c may comprise a metal including, for example, tantalum (Ta) as a main component.

It is to be noted that although an example where the first metal oxide 106a is oxygen-deficient is described in this embodiment, both the second metal oxide 106b and the third metal oxide 106c may have an oxygen deficiency lower than that of the first metal oxide 106a, and the first metal oxide 106a is not necessarily oxygen-deficient.

Here, the oxygen deficiency refers to a ratio of deficient oxygen in a metal oxide relative to an amount of oxygen included in an oxide having a stoichiometric composition (when stoichiometric compositions are present, a stoichiometric composition having the highest resistance value among the stoichiometric compositions). A metal oxide having a stoichiometric composition has a more stable and higher resistance value than metal oxides having other compositions.

For instance, when a metal is tantalum (Ta), the stoichiometric composition of its oxide is $Ta_2O_5$ according to the above definition, which can be expressed as $TaO_{2.5}$, and the oxygen deficiency of $TaO_{2.5}$ is 0% while the oxygen deficiency of $TaO_{1.5}$ is determined by the expression; the oxygen deficiency=(2.5−1.5)/2.5=40%. Moreover, a metal oxide having excessive oxygen has an oxygen deficiency that is a negative value. It is to be noted that unless otherwise noted, an oxygen deficiency is assumed to include a positive value, 0, and a negative value in the DESCRIPTION.

An oxide having a low oxygen deficiency is closer to an oxide having its stoichiometric composition and therefore has a high resistance value while an oxide having a high oxygen deficiency is closer to a metal included in the oxide and therefore has a low resistance value.

An oxygen content atomic percentage is a ratio of oxygen to the total number of atoms. For example, the oxygen content atomic percentage of $Ta_2O_5$ is a ratio of oxygen to the total number of atoms (O/(Ta+O)) and is thus 71.4 atm %. This means that an oxygen-deficient tantalum oxide has an oxygen content atomic percentage higher than 0 and lower than 71.4 atm %. For instance, when a metal included in the first metal oxide 106a and a metal included in the second metal oxide 106b are of the same type, an oxygen content atomic percentage and an oxygen deficiency are in a correspondence relationship. To put it another way, when the second metal oxide 106b has an oxygen content atomic percentage higher than that of the first metal oxide 106a, the second metal oxide 106b has an oxygen deficiency lower than that of the first metal oxide 106a.

Both the second metal oxide 106b and the third metal oxide 106c have an oxygen deficiency lower than that of the first metal oxide 106a. For this reason, both the second metal oxide 106b and the third metal oxide 106c have a resistance value higher than that of the first metal oxide 106a. In particular, the third metal oxide 106c has insulation properties.

With such a structure, the third metal oxide 106c having a high resistance value is disposed on a lateral side of the first metal oxide 106a having a low resistance value so that the area of a region S2, in a planar direction, of the second metal oxide 106a having the low resistance value (or a contact region between the first metal oxide 106a having the low resistance value and the second variable resistance layer 1062) is smaller than the area of an electrode region S1 of the second electrode 107. Here, the planar direction is a direction that crosses drive current flowing to the nonvolatile memory element 20.

As a result, the density of current flowing from the first metal oxide 106a to the second metal oxide 106b (the second variable resistance layer 1062) increases, and a conductive path is easily formed in the second metal oxide 106b. This makes it possible to reduce an initial breakdown voltage of the nonvolatile memory element 20, and achieve initialization of the nonvolatile memory element 20 at low voltage.

In other words, most of the current flowing in the first variable resistance layer 1061 including the first metal oxide 106a and the third metal oxide 106c will flow in the first metal oxide 106a having the low resistance value (i.e., the center of the first variable resistance layer 1061), which increases the density of current flowing from the first variable resistance layer 1061 to the second variable resistance layer 1062 and enables the initialization of the variable resistance element 20 at lower voltage.

Although the above describes how the density of current flowing from the first variable resistance layer 1061 to the second variable resistance layer 1062 increases, the same applies to the current flowing in the opposite direction (the current flowing from the second variable resistance layer 1062 to the first variable resistance layer 1061).

Moreover, although the above describes the example where the nonvolatile memory element 20 includes, as the layers, the first electrode 105, the first variable resistance layer 1061, the second variable resistance layer 1062, and the second electrode 107 in this order from the bottom, the same applies to a nonvolatile memory element including the layers in a reverse order, that is, including, as the layers, the electrode 107, the second variable resistance layer 1062, the first variable resistance layer 1061, and the first electrode 105 in this order from the bottom. For the nonvolatile memory element of which the structure is turned upside down, the term "lower surface" or the like in the above description is read as an upper surface or the like appropriately.

A metal other than tantalum may be used for the variable resistance layer 106. A transition metal or aluminum (Al) can be used for the variable resistance layer 106. Tantalum (Ta), titanium (Ti), hafnium (Hf), zirconium (Zr), niobium (Nb), tungsten (W), nickel (Ni) etc., may be used as the transition metal. Since the transition metal can take a plurality of oxidation states, this can provide different resistance states by an oxidation-reduction reaction.

For example, it has been confirmed that the resistance value of the variable resistance layer 106 can be changed at high-speed and in a stable manner when hafnium oxide is used, the composition of the first metal oxide 106a is $HfO_x$ where x is at least 0.9 and at most 1.6, and the compositions of the second metal oxide 106b and the third metal oxide 106c are $HfO_y$ where y is greater than x. In this case, the film thickness of the second metal oxide 106b is preferably at least 3 nm and at most 4 nm.

Moreover, it has been confirmed that the resistance value of the variable resistance layer 106 can be changed at high-speed and in a stable manner when zirconium oxide is used, the composition of the first metal oxide 106a is $ZrO_x$ where x is at least 0.9 and at most 1.4, and the compositions of the second metal oxide 106b and the third metal oxide 106c are $ZrO_y$ where y is greater than x. In this case, the film thickness of the second metal oxide 106b is preferably at least 1 nm and at most 5 nm.

It is to be noted that a first metal included in the first metal oxide 106a and the third metal oxide 106c and a second metal included in the second metal oxide 106b may be different metals. In this case, the second metal oxide 106b may have a lower oxygen deficiency than the first metal oxide 106a, that is, the former may have a higher resistivity than the latter. With such a structure, voltage applied between the first electrode 105 and the second electrode 107 in changing the resistance is distributed more to the second metal oxide 106b, with the result that an oxidation-reduction reaction in the second metal oxide 106b can be made more likely to occur.

Furthermore, when mutually different materials are used for the first metal included in the first variable resistance layer 1061 (the first metal oxide 106a and the third metal oxide 106c) and the second metal included in the second variable resistance layer 1062 (the second metal oxide 106b), the second metal may have a standard electrode potential lower than that of the first metal. The standard electrode potential having a larger value represents a property of being more difficult to oxidize. With this, the oxidation-reduction reaction can occur easily in the second metal oxide having a relatively low standard electrode potential. It is to be noted that an oxidation-reduction reaction in a tiny filament (a conductive path) formed in the second metal oxide 106b having high resistance changes the resistance value (oxygen deficiency) of the second metal oxide 106b, which presumably results in a resistance change phenomenon.

For example, stable resistance change operation is achieved when each of the first metal oxide 106a and the third metal oxide 106c comprises an oxygen-deficient tantalum oxide while the second metal oxide 106b comprises a titanium oxide ($TiO_2$). Titanium (with the standard electrode potential=−1.63 eV) is a material having a lower standard electrode potential than the standard electrode potential of tantalum (with the standard electrode potential=−0.6 eV).

The oxidation-reduction reaction occurs more easily in the second metal oxide 106b when the second metal oxide 106b comprises a metal oxide having a lower standard electrode potential than the first metal oxide 106a and the third metal oxide 106c. Aluminum oxide ($Al_2O_3$) can be used, as another combination, for the second metal oxide layer to be eventually a high resistance layer. For instance, the first metal oxide 106a may comprise oxygen-deficient tantalum oxide ($TaO_x$), and the second metal oxide 106b may comprise aluminum oxide ($Al_2O_3$).

Each resistance change phenomenon in the variable resistance layer having a laminated structure of the above materials presumably occurs by an oxidation-reduction reaction in a filament (a conductive path) in a tiny localized region formed in the second metal oxide 106b having high resistance, which changes the resistance value of the variable resistance layer.

Specifically, with positive voltage applied to the second electrode 107 connected to the second metal oxide 106b with reference to the first electrode 105, oxygen ions in the variable resistance layer 106 are attracted toward the second metal oxide 106b. This causes an oxidation reaction in the tiny localized region formed in the second metal oxide 106b, which decreases the oxygen deficiency of the localized region. As a result, the filament in the localized region becomes less conductive, which presumably increases the resistance value of the variable resistance layer 106.

On the other hand, with negative voltage applied to the second electrode 107 connected to the second metal oxide 106b with reference to the first electrode 105, oxygen ions in the second metal oxide 106b are forced toward the first metal oxide 106a. This causes a reduction reaction in the tiny localized region formed in the second metal oxide 106b, which increases the oxygen deficiency of the localized region. As a result, the filament in the localized region becomes more conductive, which presumably decreases the resistance value of the variable resistance layer 106.

The second electrode 107 connected to the second metal oxide 106b having a lower oxygen deficiency comprises platinum (Pt), iridium (Ir), palladium (Pd), or the like, which is a material having a higher standard electrode potential than the standard electrode potentials of the metal included in the second metal oxide 106b and the material of the first electrode 105. Moreover, it is preferable that the first electrode 105 connected to the first metal oxide 106a having a higher oxygen deficiency comprise tungsten (W), nickel (Ni), tantalum (Ta), titanium (Ti), aluminum (Al), tantalum nitride (Tan), titanium nitride (TiN), and so on, which is a material having a lower standard electrode potential than that of the metal included in the first metal oxide. The standard electrode potential having a larger value represents a property of being more difficult to oxidize. Stated differently, it is preferable that a standard electrode potential $V_2$ of the second electrode 107, a standard electrode potential $V_{r2}$ of the metal included in the second metal oxide 106b, a standard electrode potential $V_{r1}$ of the metal included in the first metal oxide 106a, and a standard electrode potential $V_1$ of the first electrode 105 satisfy the relations $V_{r2}<V_2$ and $V_1<V_2$. Furthermore, it is preferable that the relations $V_2<V_{r2}$ and $V_{r1} \geq V_1$ be satisfied.

With the above structure, the oxidation-reduction reaction selectively occurs in the second metal oxide 106b near the interface between the second electrode 107 and the second metal oxide 106b, which provides a stable resistance change phenomenon.

The following continues the description of the side wall protecting layer 108.

The side wall protecting layer 108 comprising a silicon nitride (with a film thickness of 20 to 50 nm) is formed on the side wall portions of the variable resistance layer 106 and the first interlayer insulating layer 102. Moreover, the side wall protecting layer 108 may comprise a metal oxide, a metal nitride, or a metal acid nitride (e.g., an aluminum oxide, a titanium oxide, and so on) that have insulation properties and oxygen barrier properties other than the silicon nitride.

Here, a conductive path formed by the initial breakdown process presumably has a filament-like shape and a diameter of approximately 10 nm.

After earnest studies, the inventors have found that the formation of the conductive path by the initial breakdown process largely depends on the density of current flowing to a variable resistance layer.

Thus, there is a problem that a variation in effective element dimension and area of nonvolatile memory elements to which current flows causes a variation in conductive path formed by the initial breakdown process among the nonvolatile memory elements. In other words, the current flowing to each nonvolatile memory element varies, which causes a decrease in yield. In addition, characteristics such as retention (data retention characteristics) and endurance (the number of times data is rewritten) vary from nonvolatile memory element to nonvolatile memory element which further decreases the yield of the nonvolatile memory elements.

As above, the variation in effective element dimension and area of the nonvolatile memory elements to which the current flows causes the variation in density of current flowing when a resistance change occurs, that is, a variation in effective area of a cross section to which the current flows. This leads to failure, and there is a fear for the decrease in yield or decrease in reliability.

One of causes for a variation in effective element dimension and area of the variable resistance layer 106 to which current flows is oxidation from side walls of the third metal oxide 106c by oxygen plasma, material gas, or the like in the deposition step for depositing, on the variable resistance layer 106, the second interlayer insulating layer 109 comprising a silicon oxide after the formation of the variable resistance layer 106, or further oxidation from the side walls of the third metal oxide 106c by oxygen diffusion from the second interlayer insulating layer 109 by heat treatment in a step subsequent to the deposition step.

Such unintentional further oxidation from the side walls of the third metal oxide 106c reduces the effective cross-sectional area of the variable resistance layer 106, and additionally causes the horizontal dimension of the third metal oxide 106c to vary among the variable resistance layers 106 or in a wafer plane.

In view of this, the present invention makes it possible to prevent the variation in effective element dimension and area of the variable resistance layer 106 to which the current flows, by forming the side wall protecting layer 108 to cover the sides of the variable resistance layer 106 (in particular the sides of the third metal oxide 106c) which are connected neither the first electrode 105 nor the second electrode 107, particularly with a goal of preventing the oxidation from the side walls of the variable resistance layer 106 by the step after the formation of the variable resistance layer 106. As a result, the variation in density of the current flowing to the variable resistance layer 106 is decreased, and electrical failure is reduced, which makes it possible to prevent the decrease in yield and increase the reliability.

Moreover, it is preferable that the side wall protecting layer 108 comprise a silicon nitride.

The side wall protecting layer comprising the silicon nitride servers as a barrier film for moisture, oxygen, or the like. For this reason, by covering the nonvolatile memory element with the side wall protecting layer, it is possible to prevent the oxidation from the side wall portions of the variable resistance layer by material gas, oxygen plasma, or the like when an interlayer insulating layer comprising the silicon oxide or the like is deposited after the formation of the nonvolatile memory element, or the diffusion of oxygen included in the interlayer insulating layer into the variable resistance layer by the subsequent heat treatment. Therefore, it is possible to prevent the oxidation from the side wall portions of the variable resistance layer, and suppress a change of the effective cross-sectional area that can contribute to a resistance change operation.

[Nonvolatile Memory Device Manufacturing Method]

FIG. 2A to FIG. 2J each are a cross-sectional view illustrating a method for manufacturing principal parts of the nonvolatile memory device 21 according to Embodiment 1 of the present invention. The following describes the method for manufacturing principal parts of the nonvolatile memory device 21 according to Embodiment 1 with reference to these figures.

Figure 2A:
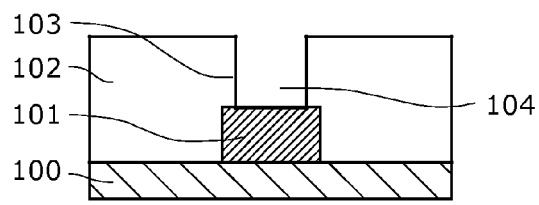
FIG. 2A is a cross-sectional view illustrating a method for manufacturing principal parts of the nonvolatile memory device according to Embodiment 1 of the present invention.

As illustrated in FIG. 2A, in a step of forming a first line 101, a conductive layer comprising aluminum or the like and having a thickness of 400 to 600 nm is formed on a substrate 100 in which a transistor, a lower-layer line, and the like are formed, and patterning this conductive layer results in the first line 101.

Next, in a step of forming a first interlayer insulating layer 102, an insulating layer is formed on the substrate 100 so as to cover the first line 101 and then has its surface planarized, which results in the first interlayer insulating layer 102 having a thickness of 500 to 1000 nm. For the first interlayer insulating layer 102, nitride silicon ($Si_3N_4$) or a plasma tetraethoxysilane (TEOS) film may be used, and in order to reduce a parasitic capacity between the lines, a fluorine-containing oxide, such as fluorinated silicate glass (FSG), and a low-k material may also be used.

Figure 2B:
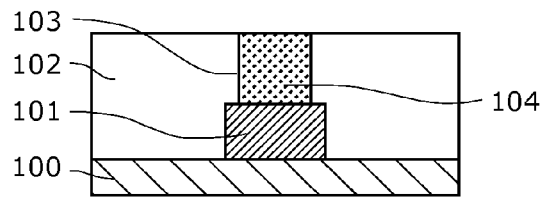
FIG. 2B is a cross-sectional view illustrating the method for manufacturing principal parts of the nonvolatile memory device according to Embodiment 1 of the present invention.

Next, as illustrated in FIG. 2B, in a step of forming a first contact hole 103, patterning is performed using a desired mask to form the first contact hole 103 having a thickness of 50 to 300 nm which penetrates the first interlayer insulating layer 102 and extends to the first line 101. If the first line 101 has a smaller width than the width of the first contact hole 103, the area of contact between the first line 101 and a first contact plug 104 changes due to an impact of mask misalignment, which causes, for example, variations in cell current. From the perspective of preventing this, the width of the first line 101 is set to be larger than the size of the first contact hole 103 in this embodiment.

Next, in a step of forming the first contact plug 104, first, as lower layers, Ti/TiN layers functioning as an adhesive layer and a diffusion barrier and each having a thickness of 5 to 30 nm are deposited in a sputtering method, and then, as an upper layer, 200 to 400 nm of tungsten (W) which will be the primary component of the contact plug is deposited in a chemical vapor deposition (CVD) method. At this time, the first contact hole 103 is filled up with a conductive layer having a laminated structure (W/Ti/TiN structure) which will eventually be the first contact plug 104.

Next, in the step of forming the first contact plug 104, the entire surface of the wafer is planarized and polished using a chemical mechanical polishing (CMP) method to remove unnecessary part of the conductive layer on the first interlayer insulating layer 102, which results in the first contact plug 104 formed in the first contact hole 103.

Figure 2C:
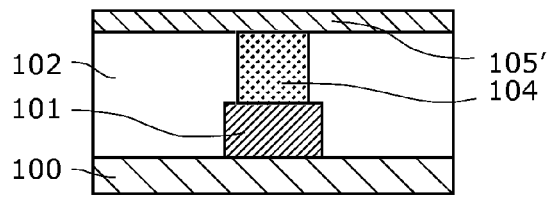
FIG. 2C is a cross-sectional view illustrating the method for manufacturing principal parts of the nonvolatile memory device according to Embodiment 1 of the present invention.

Next, as illustrated in FIG. 2C, a tantalum nitride 105' to be eventually a first electrode 105 is disposed, using the sputtering method, as a 20 to 100 nm-thick film on the first interlayer insulating layer 102 so as to cover the first contact plug 104.

Here, although the tantalum nitride 105' is disposed using only the sputtering method, a lower electrode may be planarized using an additional CMP method after the deposition of the tantalum nitride 105'.

Figure 2D:
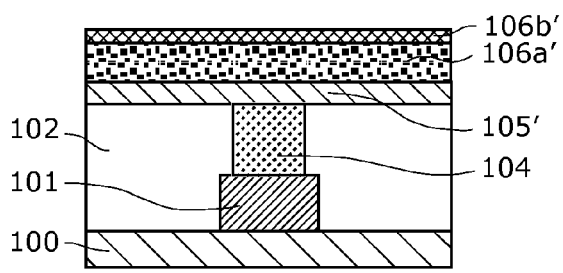
FIG. 2D is a cross-sectional view illustrating the method for manufacturing principal parts of the nonvolatile memory device according to Embodiment 1 of the present invention.

Next, as illustrated in FIG. 2D, a first metal oxide 106a' and a second metal oxide 106b' are deposited as films on the tantalum nitride 105'.

First, $TaO_x$ that is the first metal oxide 106a is deposited as the film using a so-called reactive sputtering method in which a tantalum target is sputtered in an argon and oxygen gas atmosphere. The first metal oxide 106a has an oxygen content atomic percentage of 55 to 65 atm % (where x is 1.22 to 1.86) that is effective in causing a resistance change, a resistivity of 1 to 50 mΩ·cm, and a film thickness of 20 to 100 nm.

Subsequently, a second variable resistance layer 1062 comprising the second metal oxide 106b is formed on the first metal oxide 106a. As with the first metal oxide 106a, $TaO_y$ that is the second metal oxide 106b is formed using the reactive sputtering method in which the tantalum target is sputtered in the argon and oxygen gas atmosphere. The second metal oxide 106b has: an oxygen content atomic percentage of 68 to 71 atm % (where y is 2.1 to 2.5) that is effective in causing a resistance change in a structure obtained by stacking the second variable resistance layer 1062 on the first metal oxide 106a; a resistivity of at least $10^7$ mΩ·cm; and a film thickness of 3 to 10 nm.

Here, although the second variable resistance layer 1062 is formed using the reactive sputtering method, the surface layer of the first metal oxide 106a may be oxidized using plasma oxidation to form the second metal oxide 106b having a high oxygen content atomic percentage. With the sputtering method, it is difficult to provide the metal oxide with oxygen more than its stoichiometric composition, but a plasma oxidation process allows oxygen to be diffused into grain boundaries, flaws, and the like of the tantalum oxide, which results in a metal oxide having a higher oxygen content atomic percentage that is effective in reducing the leak current. In forming the second variable resistance layer 1062, it is also possible to employ a reactive sputtering method in which a tantalum oxide target is sputtered in an oxygen gas atmosphere.

Figure 2E:
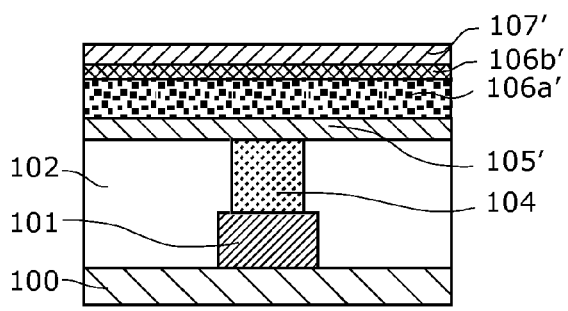
FIG. 2E is a cross-sectional view illustrating the method for manufacturing principal parts of the nonvolatile memory device according to Embodiment 1 of the present invention.

Next, as illustrated in FIG. 2E, a noble metal (such as Pt, Ir, or Pa) layer which will be a second electrode 107 after patterning is disposed as a film on the second metal oxide 106b'.

Figure 2F:
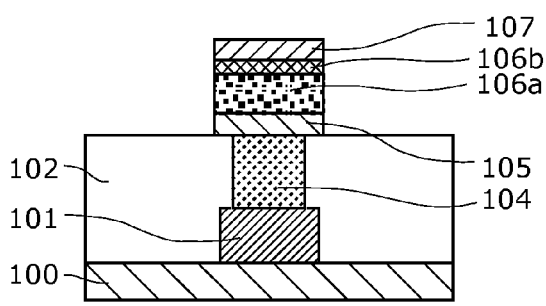
FIG. 2F is a cross-sectional view illustrating the method for manufacturing principal parts of the nonvolatile memory device according to Embodiment 1 of the present invention.

Next, as illustrated in FIG. 2F, a stacked film including, as the layers, the noble metal layer 107', the second metal oxide 106b', the first metal oxide 106a', and the tantalum nitride 105' is patterned into a nonvolatile memory element.

Since noble metals representing materials having high standard electrode potentials are difficult to etch, the nonvolatile memory element 20 can be formed using such a noble metal as a hard mask in the case where an upper electrode comprises the noble metal. Although the patterning is collectively performed on all the layers included in the stacked film using the same mask in this step, the patterning may be performed for each layer included in the stacked film.

Figure 2G:
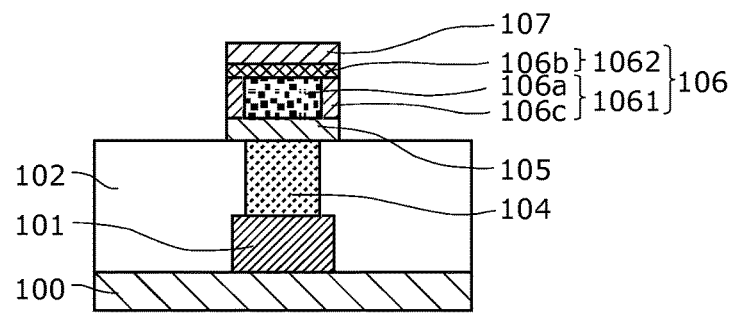
FIG. 2G is a cross-sectional view illustrating the method for manufacturing principal parts of the nonvolatile memory device according to Embodiment 1 of the present invention.

Next, as illustrated in FIG. 2G, a third metal oxide 106c having insulating properties is formed on the sides of the first metal oxide 106a exposed after the patterning, by annleaing the patterned stacked film in the oxygen atmosphere.

Figure 2H:
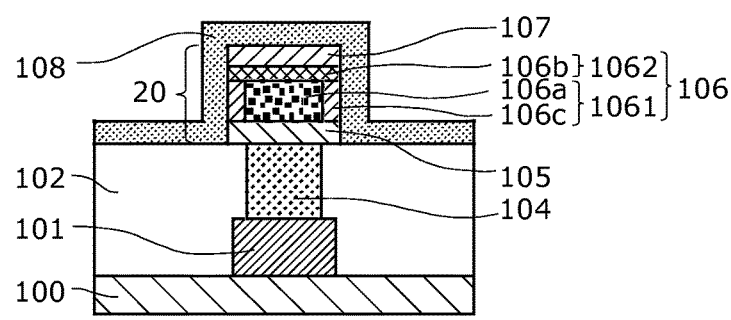
FIG. 2H is a cross-sectional view illustrating the method for manufacturing principal parts of the nonvolatile memory device according to Embodiment 1 of the present invention.

Next, as illustrated in FIG. 2H, a side wall protecting layer 108 comprising a silicon nitride (with a film thickness of 20 nm) is deposited on the stacked film of which the sides are oxidized and the first interlayer insulating layer 102, using plasma CVD.

Low pressure CVD is usually used as a method having satisfactory step coverage for a convex superior portion, to deposit a silicon nitride. The low pressure CVD makes it possible to deposit a thin film having satisfactory step coverage, because reactive molecules have a long mean free path. In the low pressure CVD, however, the deposition is performed under high temperature of 650 to 800° C. that is temperature in a deposition chamber, and thus the low pressure CVD cannot be used after formation of a line.

In view of this, in this embodiment, it is preferable that the side wall protecting layer 108 comprising the silicon nitride be deposited using the plasma CVD that allows deposition at lower temperature (250 to 400° C.) than the low pressure CVD. Moreover, the side wall protecting layer 108 comprising the silicon nitride may be deposited using sputtering. The reactive sputtering in which a polycrystalline silicon target is sputtered in a mixed gas atmosphere of argon and nitrogen may be used for the deposition of the silicon nitride by sputtering.

Through these steps, the first variable resistance layer 1061 has a core portion excluding neighboring portions of the sides of the first variable resistance layer 1061 and comprising the first metal oxide 106a that is oxygen-deficient, and the neighboring portions of the sides comprising the third metal oxide 106c having the lower oxygen deficiency than the first metal oxide 106a; and the second variable resistance layer 1062 comprises the second metal oxide 106b having the lower oxygen deficiency than the first metal oxide 106a.

The first variable resistance layer 1061 of which the neighboring portions of the sides are oxidized and the second variable resistance layer 1062 constitute the variable resistance layer 106, and the first electrode 105, the variable resistance layer 106, the second electrode 107, and the side wall protecting layer 108 constitute the nonvolatile memory element 20.

Figure 2I:
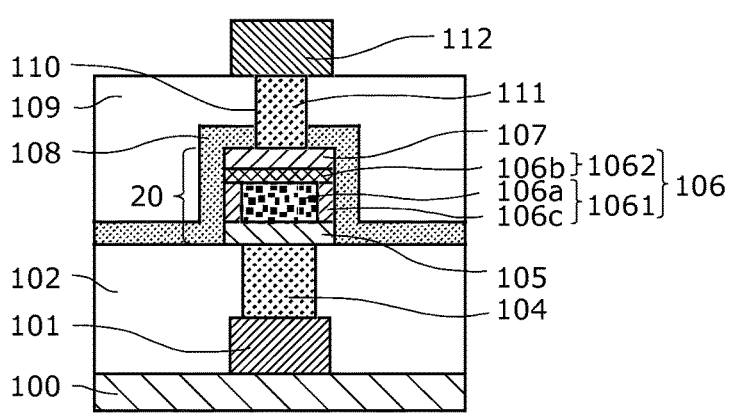
FIG. 2I is a cross-sectional view illustrating the method for manufacturing principal parts of the nonvolatile memory device according to Embodiment 1 of the present invention.

Next, as illustrated in FIG. 2I, a second interlayer insulating layer 109 having a thickness of 500 to 1000 nm is formed to cover the variable resistance layer 106 and the side wall protecting layer 108, and a second contact hole 110 and a second contact plug 111 are formed by the same manufacturing method as in FIG. 2A and FIG. 2B. Then, a second line 112 is formed to cover the second contact plug 111.

Figure 2J:
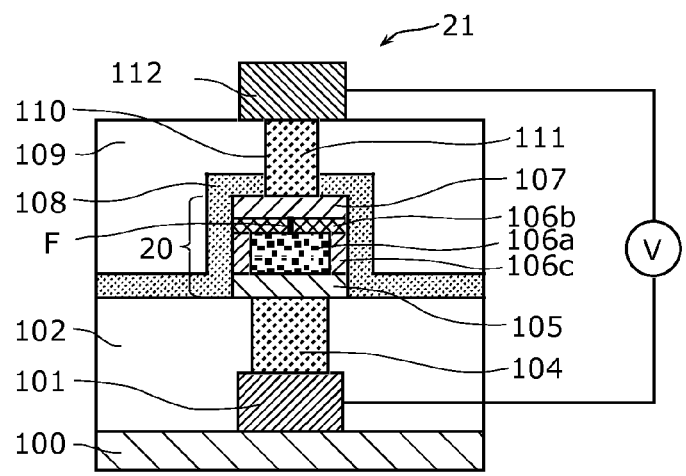
FIG. 2J is a cross-sectional view illustrating the method for manufacturing principal parts of the nonvolatile memory device according to Embodiment 1 of the present invention.

Lastly, as illustrated in FIG. 2J, a localized region including a filament F of which an oxygen deficiency reversibly changes in response to an application of electric pulses is formed in the second variable resistance layer 1062 by applying an initial breakdown voltage to the nonvolatile memory element 20 via the first line 101 and the second line 112, and the nonvolatile memory device 21 is completed.

[Effect of Suppressing Oxidation of Side Wall Portions of Nonvolatile Memory Element by Side Wall Protecting Layer]

The following describes an effect of suppressing oxidation of side wall portions by the side wall protecting layer 108 provided to the nonvolatile memory element 20 according to Embodiment 1.

Figure 3:
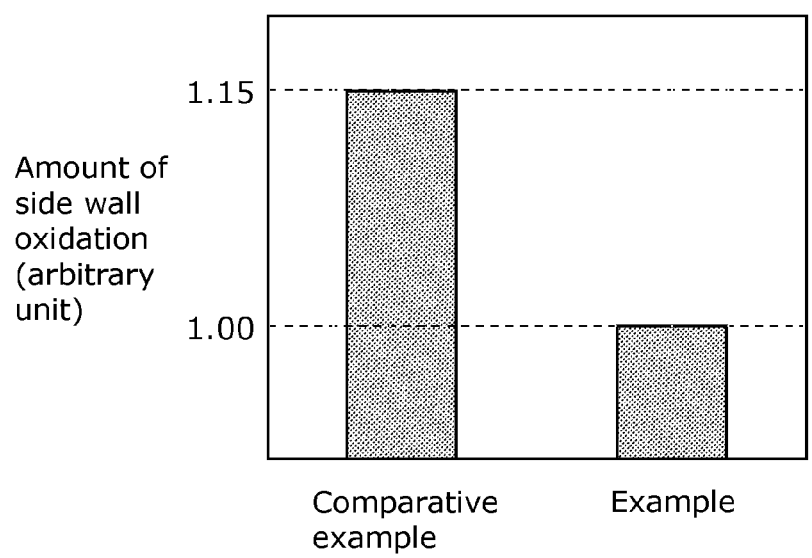
FIG. 3 is a graph comparing amounts of side wall oxidation in an example of the present invention and a comparative example.

FIG. 3 is a graph comparing an amount of side wall oxidation of the nonvolatile memory element 20 (Example) according to Embodiment 1 and an amount of side wall oxidation of the nonvolatile memory element 10 (Comparative example) without the side wall protecting layer illustrated in FIG. 20. It is to be noted that the amount of side wall oxidation refers to each of a width D illustrated in FIG. 1 and a width of corresponding part in FIG. 20. The amount of side wall oxidation illustrated in FIG. 3 is a calculated value obtained from results of electrically measuring the initial resistance value of the nonvolatile memory element.

It is clear from FIG. 3 that the amount of side wall oxidation of the comparative example without the side wall protecting layer is larger than that of the example with the side wall protecting layer by 15%.

This shows that the side wall protecting layer 108 prevents the oxidation from the side wall portions of the variable resistance layer 106 by material gas, oxygen plasma, or the like when the second interlayer insulating layer 109 comprising the silicon oxide or the like is deposited after the formation of the nonvolatile memory element, or the diffusion of the oxygen included in the second interlayer insulating layer 109 into the variable resistance layer 106 by the subsequent heat treatment.

[Resistance Change Characteristics of Nonvolatile Memory Element]

The following describes an effect of enhancing resistance change characteristics by the side wall protecting layer 108 provided to the nonvolatile memory element 20 according to Embodiment 1.

Figure 4:
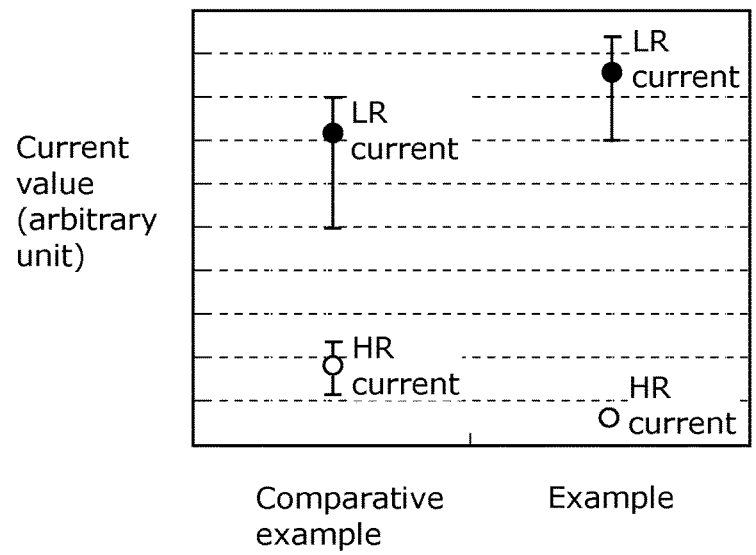
FIG. 4 is a graph comparing evaluation results of HR current and LR current flowing to a nonvolatile memory element according to the example of the present invention and a nonvolatile memory element according to the comparative example.

FIG. 4 is a graph comparing the resistance change characteristics of the nonvolatile memory element 20 (Example) according to Embodiment 1 and the resistance change characteristics of the nonvolatile memory element 10 (Comparative example) not having the side wall protecting layer.

FIG. 4 illustrates distributions of current values (i.e., resistance values) each measured when a read voltage (a voltage not causing a resistance change) is applied every time a write voltage pulse is applied in an experiment of causing each of the nonvolatile memory element 10 and the nonvolatile memory element 20 to reversibly change its resistance state by alternately applying two write voltage pulses (a voltage pulse causing the nonvolatile memory element to change to a high resistance state and a voltage pulse causing the nonvolatile memory element to change to a low resistance state) having different polarities to each of the nonvolatile memory element 10 and the nonvolatile memory element 20. Black circles (LR current) and white circles (HR current) indicate representative current values in the low resistance state and representative current values in the high resistance state, respectively. Line segments extending vertically each indicate a distribution of current values.

It is clear from FIG. 4 that the example differs from the comparative example without the side wall protecting layer in that the LR current increases and the HR current decreases, and in that a widow for distinguishing between the low resistance state and the high resistance state is wider. In addition, variations in current are smaller in the example than in the comparative example.

This shows that the side wall protecting layer 108 prevents the oxidation from the side wall portions of the variable resistance layer 106 by material gas, oxygen plasma, or the like when the second interlayer insulating layer 109 comprising the silicon oxide or the like is deposited after the formation of the nonvolatile memory element, or the diffusion of the oxygen included in the second interlayer insulating layer 109 into the variable resistance layer 106 by the subsequent heat treatment. It is to be noted that the side wall protecting layer provided in the example comprises nitride silicon having a thickness of 20 nm.

Figure 5:
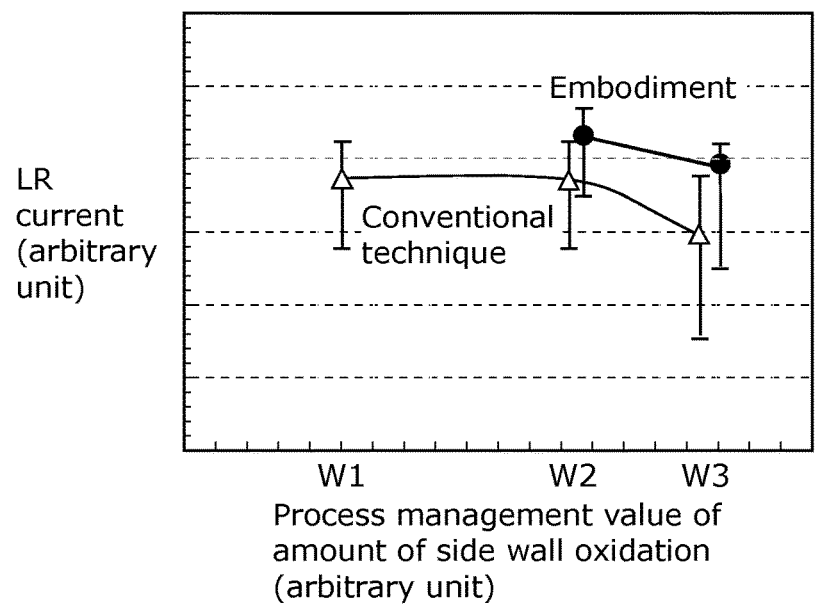
FIG. 5 is a graph comparing evaluation results of LR current flowing to the nonvolatile memory element according to the example of the present invention and the nonvolatile memory element according to the comparative example.

FIG. 5 is a graph comparing LR currents measured according to amounts of side wall oxidation for Example and Comparative example. An amount of side wall oxidation illustrated in FIG. 5 is a film thickness value of a monitor wafer in process management, and differs from the calculated value obtained from the initial resistance value in an absolute value.

It is clear from the graph of FIG. 5 that the comparative example differs from the example in that the LR current drastically decreases with an increase in the amount of side wall oxidation and is more likely to vary. In contrast, it is clear that in the example the LR current decreases along with an increase in the amount of side wall oxidation, and likeliness of the LR current to vary is reduced. This shows that the side wall protecting layer makes it possible to mitigate marginal behavior for the amount of side wall oxidation which is a problem for the nonvolatile memory element not having the side wall protecting layer.

[Exemplary Operations of Nonvolatile Memory Element]

The following describes exemplary operations of the nonvolatile memory element 20 according to this embodiment as a memory, that is, exemplary operations when writing/reading of data is performed, with reference to the Drawings.

Figure 6:
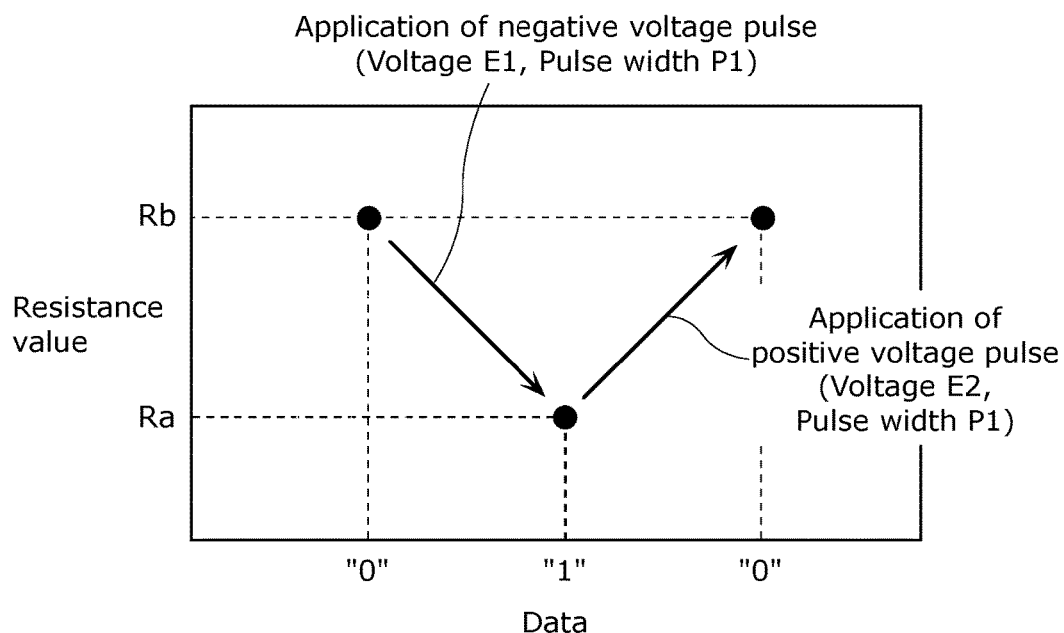
FIG. 6 is a diagram illustrating an exemplary operation when data is written into a nonvolatile memory element according to Embodiment 1 of the present invention.

FIG. 6 is a diagram illustrating an exemplary operation when data is written into the nonvolatile memory element 20 according to Embodiment 1 of the present invention.

As illustrated in FIG. 6, alternately applying two electric pulses between the first electrode 105 and the second electrode 107 changes the resistance value of the variable resistance layer, the two electric pulses each having an amplitude that is greater than or equal to a predetermined threshold voltage, a predetermined pulse width, and a different polarity. In other words, applying a negative voltage pulse (voltage E1, pulse width P1) between the electrodes decreases the resistance value of the variable resistance layer from a high resistance value Rb to a low resistance value Ra. On the other hand, applying a positive voltage pulse (voltage E2, pulse width P1) between the electrodes increases the resistance value of the variable resistance layer from the low resistance value Ra to the high resistance value Rb.

In an example illustrated in FIG. 6, the high resistance value Rb and the low resistance value Ra are assigned to data "0" and data "1," respectively. For this reason, the data "0" is written by applying the positive voltage pulse between the electrodes to change the resistance value of the variable resistance layer to the high resistance value Rb, and also the data "1" is written by applying the negative voltage pulse between the electrodes to change the resistance value of the variable resistance layer to the low resistance value Ra.

Figure 7:
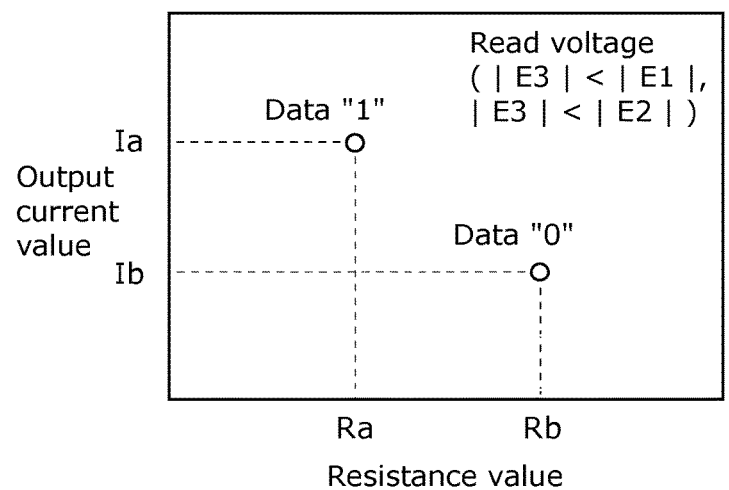
FIG. 7 is a diagram illustrating an exemplary operation when data is read from the nonvolatile memory element according to Embodiment 1 of the present invention.

FIG. 7 is a diagram illustrating an exemplary operation when data is read from the nonvolatile memory element according to Embodiment 1 of the present invention.

As illustrated in FIG. 7, when reading of data is performed, a read voltage E3 (|E3|<|E1|, |E3|<|E2|) having a sufficiently less amplitude than the electric pulses applied when the resistance value of the variable resistance layer is caused to change is applied between the electrodes. As a result, current corresponding to the resistance value of the variable resistance layer is output, and it is possible to read the written data by detecting the output current value.

In an example illustrated in FIG. 7, since an output current value Ia and an output current value Ib correspond to the resistance value Ra and the resistance value Rb, respectively, the data "1" is read when the output current value Ia is detected, and the data "0" is read when the output current value Ib is detected.

As stated above, the nonvolatile memory element 20 operates as the memory by the variable resistance layer serving as a storage unit in a region between the first electrode 105 and the second electrode 107.

[Effect of Side Wall Protecting Layer in Multilayer Wiring Structure]

As mentioned above, the nonvolatile memory element 20 having the side wall protecting layer according to Embodiment 1 of the present invention produces the effect of preventing the oxidation from the side wall portions of the variable resistance layer 106 by material gas, oxygen plasma, or the like in the deposition step of depositing the second interlayer insulating layer 109 comprising the silicon oxide or the like after the formation of the variable resistance layer 106, or the diffusion of the oxygen included in the second interlayer insulating layer 109 into the variable resistance layer 106 by the subsequent heat treatment.

This means that even when wiring layers are formed above the variable resistance layer 106 including the side wall protecting layer 108, there is an effect of suppressing the oxidation from the side wall portions of the variable resistance layer 106 by a formation process of these wiring layers, and an influence of the oxygen diffusion into the variable resistance layer. In other words, it means that the introduction of the side wall protecting layer 108 allows multilayer wiring above the nonvolatile memory element.

To verify the effect, three evaluation samples are prepared, and experiments for comparing amounts of side wall oxidation of the respective evaluation samples are conducted.

Figure 8A:
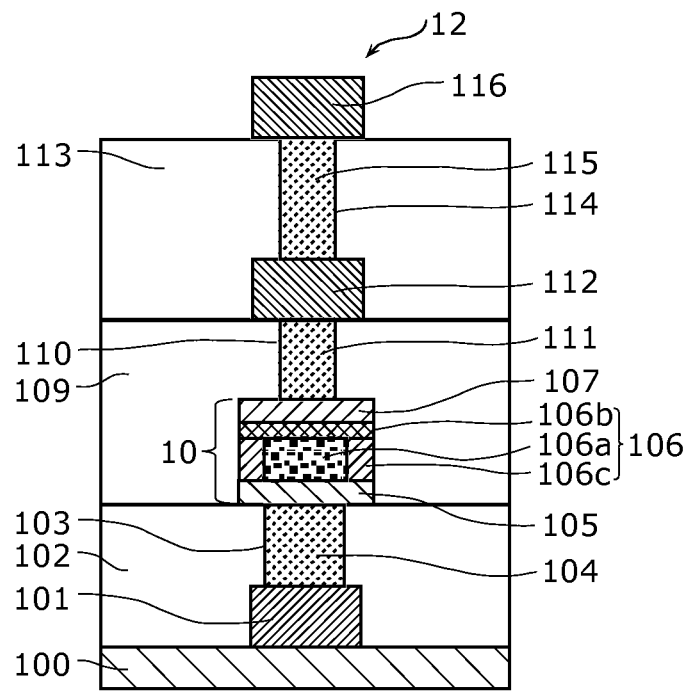
FIG. 8A is a cross-sectional view illustrating an exemplary structure of a nonvolatile memory device according to Comparative Example 1.
Figure 8B:
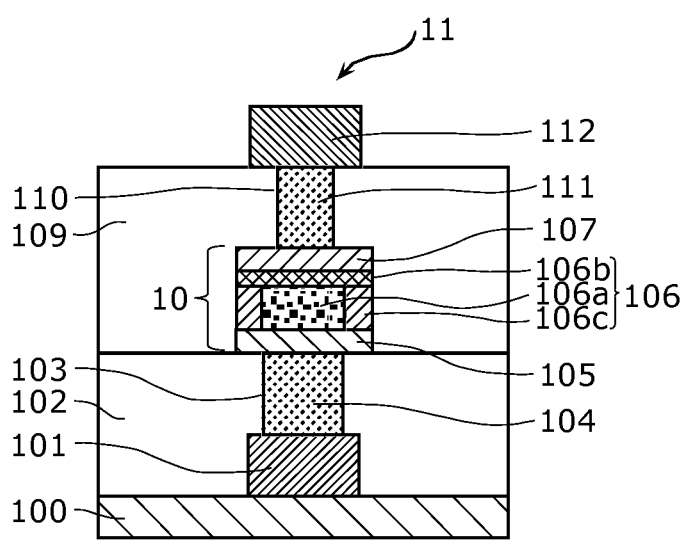
FIG. 8B is a cross-sectional view illustrating an exemplary structure of a nonvolatile memory device according to Comparative Example 2.
Figure 8C:
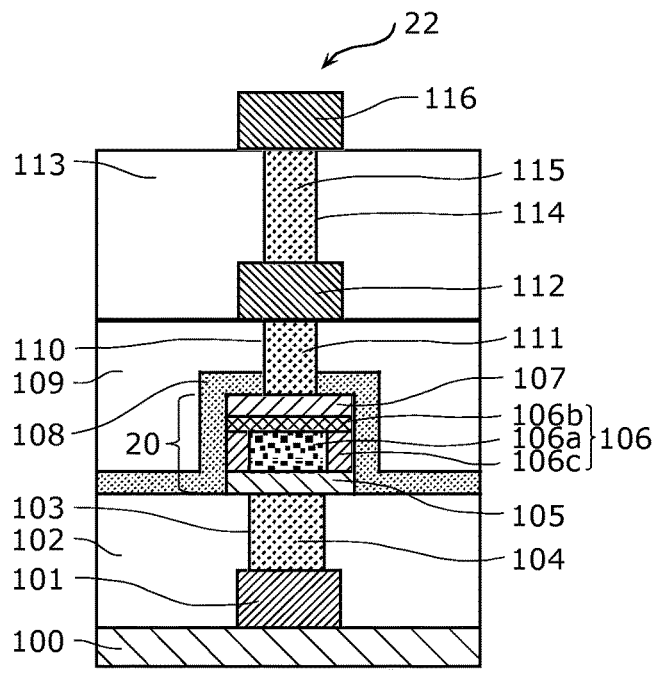
FIG. 8C is a cross-sectional view illustrating an exemplary structure of a nonvolatile memory device according to the example of the present invention.

FIG. 8A, FIG. 8B, and FIG. 8C each are a cross-sectional view schematically illustrating a cross-section structure of a corresponding one of evaluation samples prepared as Comparative example 1, Comparative example 2, and Example.

The comparative example 1 is a nonvolatile memory device 12 (FIG. 8A) obtained by forming, above the nonvolatile memory device 11 illustrated in FIG. 20, an upper layer wiring structure including a third interlayer insulating layer 113, a third contact hole 114, a third contact plug 115, and a third line 116, the comparative example 2 is the nonvolatile memory device 11 illustrated in FIG. 20 (FIG. 8B), and the example is a nonvolatile memory device 22 (FIG. 8C) obtained by forming, above the nonvolatile memory device 21 illustrated in FIG. 1, an upper layer wiring structure equivalent to that of the comparative example 1.

The variable resistance layer 106 in each of the comparative example 1 and the example is affected by heat treatment in a step of forming the upper layer wiring structure. The variable resistance layer 106 in the comparative example 2 is unaffected by such heat treatment.

Figure 9:
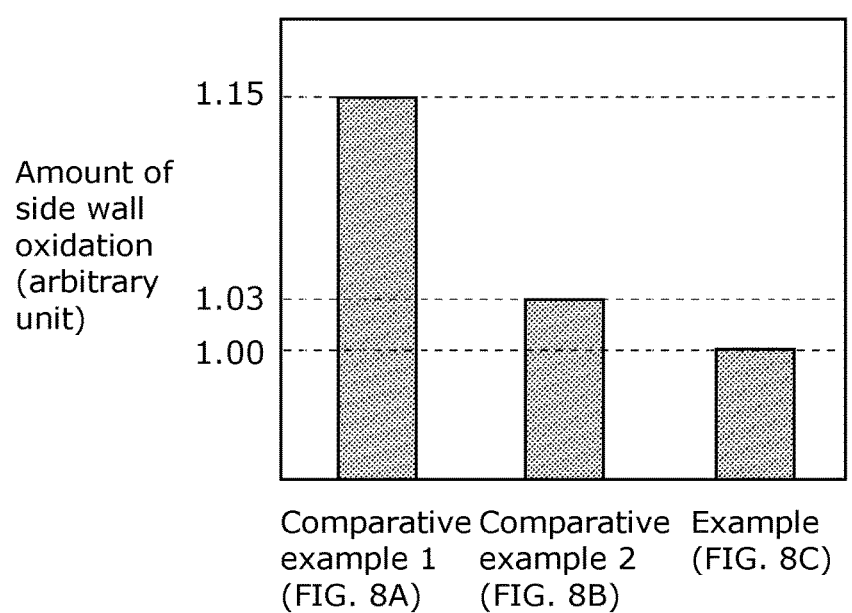
FIG. 9 is a graph comparing amounts of side wall oxidation of variable resistance layers in Comparative Example 1, Comparative Example 2, and the example.

FIG. 9 is a graph comparing amounts of side wall oxidation of the respective evaluation samples. As with FIG. 3, the amounts of side wall oxidation illustrated in FIG. 9 each are a calculated value obtained from results of electrically measuring the initial resistance value of the nonvolatile memory element.

It is clear from FIG. 9 that the example in which the side wall protecting layer and the upper layer wiring structure are provided has the amount of side wall oxidation that is (i) smaller than that of the comparative example 1 in which the upper layer wiring structure is provided but not the side wall protecting layer, and (ii) substantially equivalent to that of the comparative example 2 in which none of the side wall protecting layer and the upper layer wiring structure is provided.

This verifies that the side wall protecting layer completely suppresses the oxidation in the step of forming the upper layer wiring structure.

It can be said from the above results that the nonvolatile memory element 20 according to this embodiment provides, to the semiconductor device having the step for upper layer wiring after the formation of the nonvolatile memory element, a significant effect of stabilizing the resistance change characteristics by suppressing process of the oxidation of the side wall portions of the variable resistance layer. Moreover, even when nonvolatile memory elements are formed in layers, each of the nonvolatile memory elements has the effect of suppressing the influence of the oxidation at the time of the wiring step, and thus it is possible to form the nonvolatile memory elements having equivalent characteristics.

(Modification of Embodiment 1)

A nonvolatile memory element of which endurance characteristics are enhanced is described as a nonvolatile memory element according to a modification of Embodiment 1.

Figure 10:
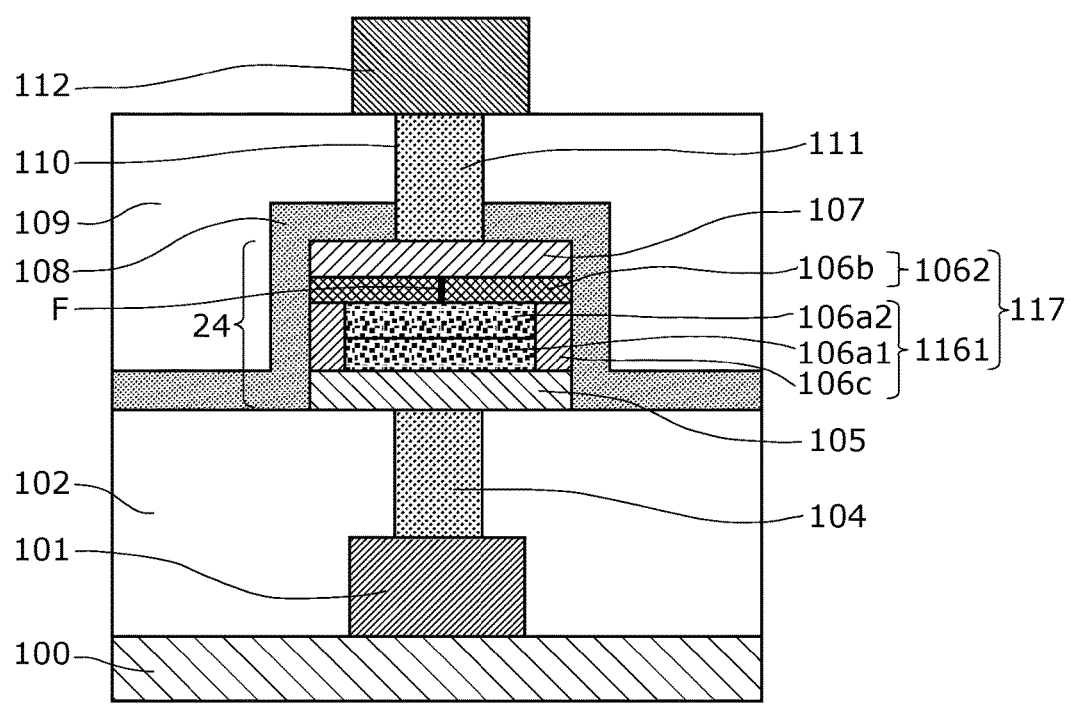
FIG. 10 is a cross-sectional view illustrating an exemplary structure of a nonvolatile memory element according to a modification of Embodiment 1 of the present invention.

FIG. 10 is a cross-sectional view illustrating an exemplary structure of a nonvolatile memory device 25 including a nonvolatile memory element 24 according to the modification of Embodiment 1.

In the nonvolatile memory element 24, a first metal oxide 106a included in a variable resistance layer 117 has a laminated structure of metal oxides having different oxygen deficiencies, and includes as layers a first region 106a1 connected to a first electrode 105 and a second region 106a connected to a second variable resistance layer 1062.

A second region 106a2 of the first metal oxide 106a has an oxygen deficiency lower than that of the first region 106a1 of the first metal oxide 106a and higher than that of a second metal oxide 106b.

In other words, the variable resistance layer 117 has a three-layered structure including, as layers, the first region 106a1 of the first metal oxide 106a which has the highest oxygen deficiency, the second region 106a2 of the first metal oxide 106a which has the intermediate oxygen deficiency, and the second metal oxide 106b having the lowest oxygen deficiency in this order.

Figure 11:
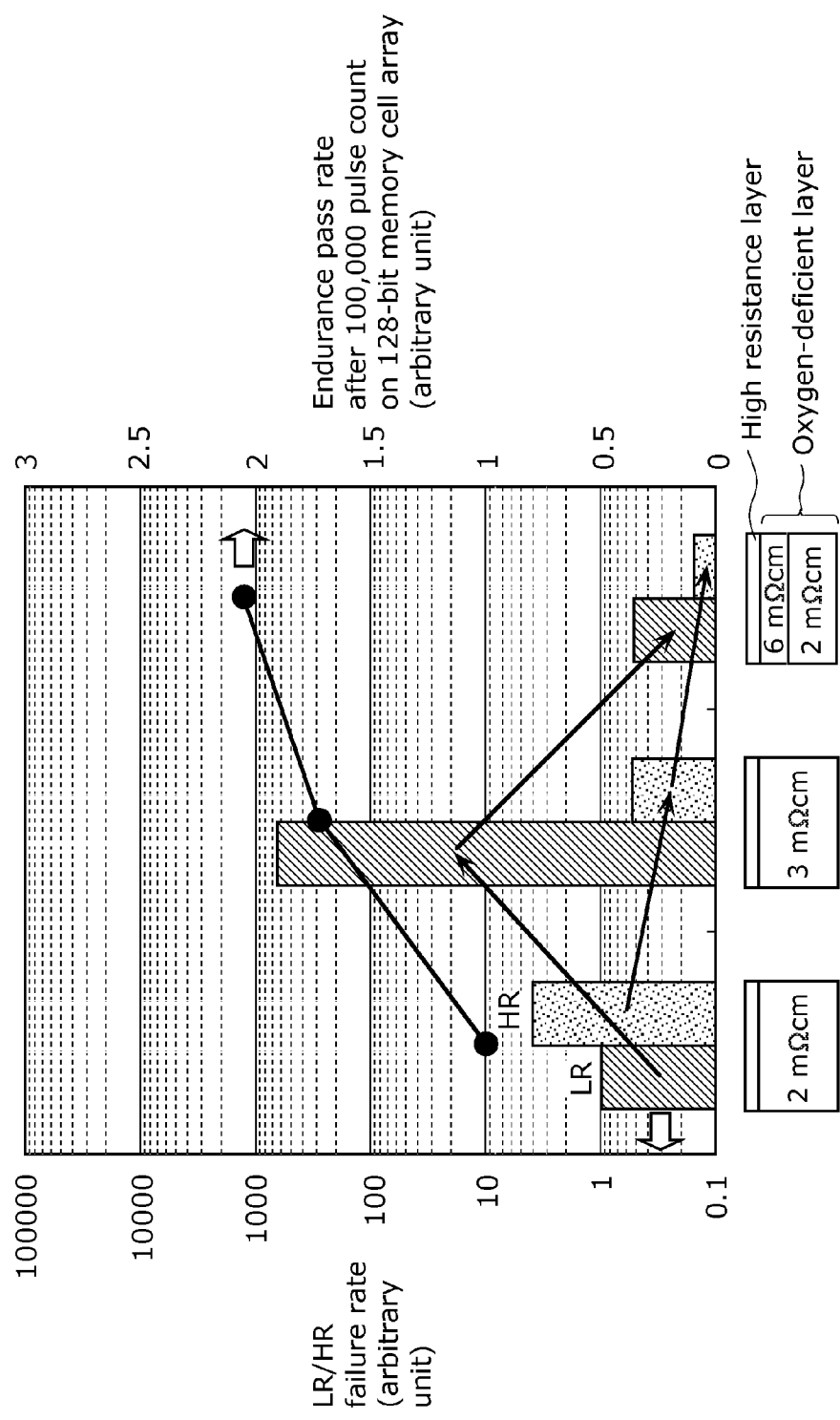
FIG. 11 is a graph illustrating a relationship between a structure and endurance characteristics of a variable resistance layer of a nonvolatile memory element.

FIG. 11 is a graph illustrating endurance characteristics of a nonvolatile memory element for samples in each of which a variable resistance layer has a two-layered structure and a sample in which a variable resistance layer has a three-layered structure.

The horizontal axis of FIG. 11 represents the structure of the variable resistance layer.

The samples shown on the left side and in the center each have the two-layered structure corresponding to the variable resistance layer 106 illustrated in FIG. 1, and include a high resistance layer and an oxygen-deficient layer corresponding to the second metal oxide 106b and the first metal oxide 106a, respectively.

The sample shown on the right side has the three-layered structure corresponding to the variable resistance layer 117 illustrated in FIG. 10, and includes a high resistance layer and an oxygen-deficient layer corresponding to the second metal oxide 106b and the first region 106a1 and the second region 106a2 of the first metal oxide 106a, respectively.

In these samples, the variable resistance layer 106 is not oxidized from its sides, and thus a third metal oxide 106c is not disposed.

The left vertical axis of FIG. 11 represents a failure rate (arbitrary unit) of HR failure in which a variable resistance layer fails to change to high resistance or LR failure in which a variable resistance layer fails to change to low resistance. The right vertical axis represents a pass rate (arbitrary unit) of endurance characteristics after 100 k (100,000) pulse counts on a memory cell array composed of nonvolatile memory elements including such a variable resistance layer.

In FIG. 11, an LR failure rate (a bar graph on the left) and an HR failure rate (a bar graph on the right) are illustrated, as data corresponding to the left vertical axis, in a pair in association with a corresponding one of the samples shown on the left side, the center, and the right side. Moreover, three black circles are plotted as data corresponding to the right vertical axis.

The bar graphs and black circles corresponding to the samples shown on the left side and in the center of FIG. 11 show that the nonvolatile memory element of which the variable resistance layer 106 has the two-layered structure has a trade-off relationship that the number of occurrences of the HR failure increases when the resistivity of the oxygen-deficient layer (the first metal oxide 106a) is decreased, and conversely the number of occurrences of the LR failure increases when the resistivity of the oxygen-deficient layer is increased.

In contrast, the bar graphs and black circle corresponding to the sample shown on the right side of FIG. 11 show that the numbers of occurrences of the HR failure and the LR failure are decreased by bi-layering the oxygen-deficient layer, that is, by tri-layering the variable resistance layer 117, which increases the pass rate of the endurance characteristics.

To put it another way, the nonvolatile memory element 24 having better endurance characteristics can be obtained by tri-layering the variable resistance layer 117 as illustrated in FIG. 10.

(Embodiment 2)

Figure 12:
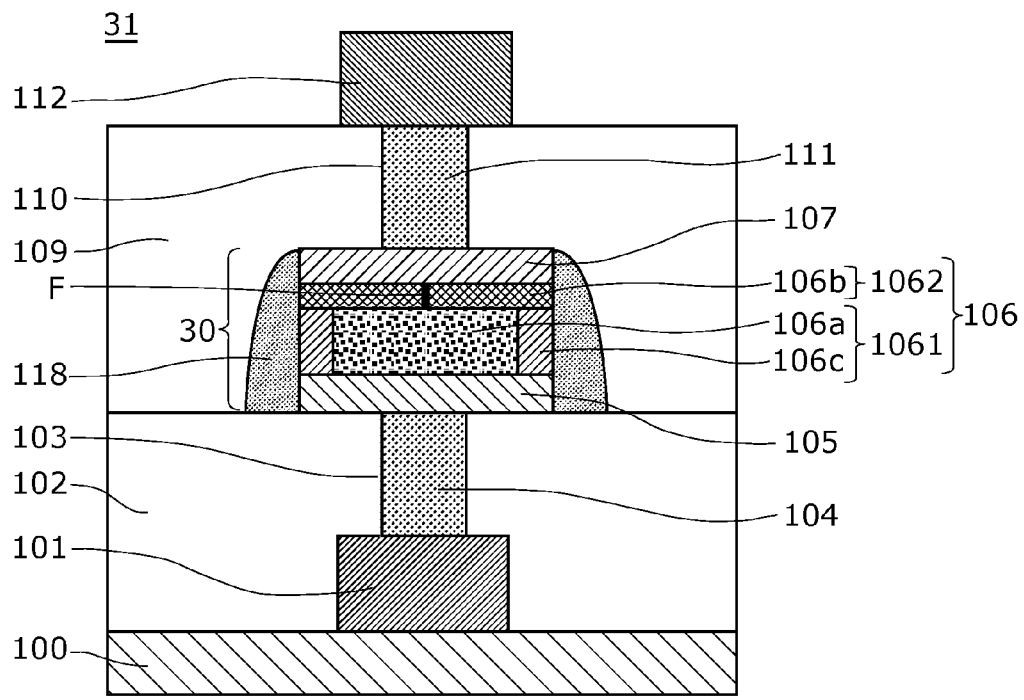
FIG. 12 is a cross-sectional view illustrating an exemplary structure of a nonvolatile memory device according to Embodiment 2 of the present invention.

FIG. 12 is a cross-sectional view illustrating an exemplary structure of a nonvolatile memory device according to Embodiment 2 of the present invention. A nonvolatile memory element 30 according to this embodiment differs from the example illustrated in FIG. 3 in that a side wall protecting layer 118 covers only the sides of the first electrode 105, the variable resistance layer 106, and the second electrode 107. Stated differently, the nonvolatile memory element 30 illustrated in FIG. 12 has a side wall structure such that the side wall protecting layer 118 covers only the side wall portions of the nonvolatile memory element 30. In Embodiment 1, since it is necessary to process, by dry etching, the two-layered film of the second interlayer insulating layer 109 and the side wall protecting layer 108 having different selection ratios when the contact hole 110 is formed, there is a fear for an addition of an etching step, a stability of a contact resistance value, or the like. In Embodiment 2, only the second interlayer insulating layer 109 is processed by dry etching when the contact hole 110 is formed, and thus such a fear is eliminated.

Figure 13A:
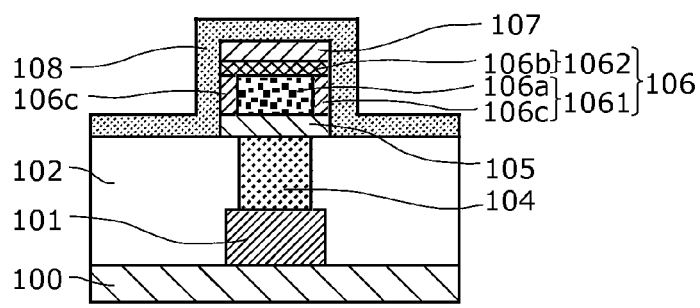
FIG. 13A is a cross-sectional view illustrating a method for manufacturing principal parts of the nonvolatile memory device according to Embodiment 2 of the present invention.

FIG. 13A to FIG. 13D each are a cross-sectional view illustrating a nonvolatile memory device manufacturing method according to Embodiment 2 of the present invention. From FIG. 13A to FIG. 13D, the same structural elements as those in FIG. 2A to FIG. 2J are denoted by the same reference signs, and descriptions thereof are omitted. As illustrated in FIG. 13A to FIG. 13D, the nonvolatile memory device manufacturing method according to Embodiment 2 differs from the nonvolatile memory device manufacturing method according to Embodiment 1 in that the side wall protecting layer 108 is not disposed on the second electrode 107. As such, steps prior to FIG. 13A are the same as those in FIG. 2A to FIG. 2H, and thus descriptions thereof are omitted.

Figure 13B:
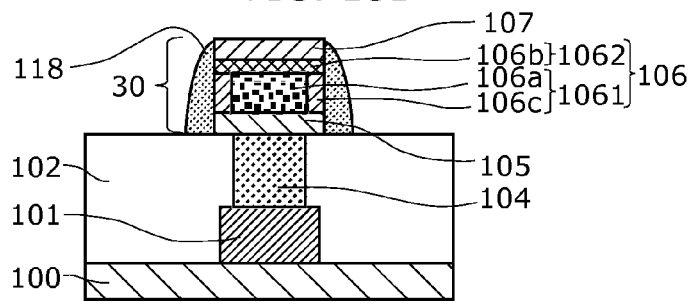
FIG. 13B is a cross-sectional view illustrating the method for manufacturing principal parts of the nonvolatile memory device according to Embodiment 2 of the present invention.
Figure 13C:
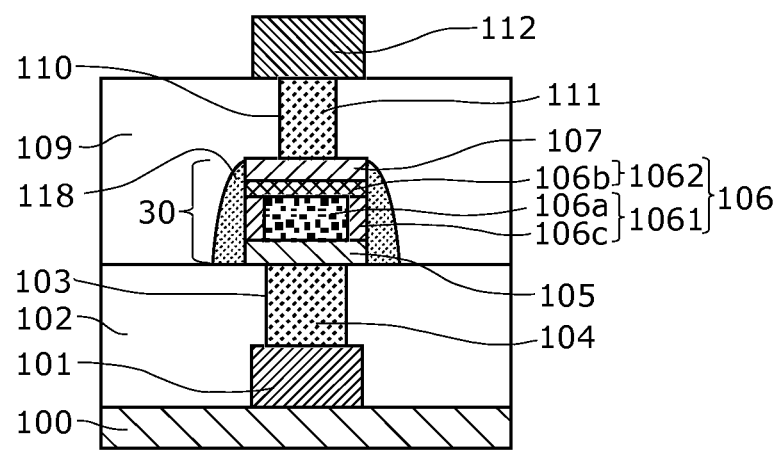
FIG. 13C is a cross-sectional view illustrating the method for manufacturing principal parts of the nonvolatile memory device according to Embodiment 2 of the present invention.
Figure 13D:
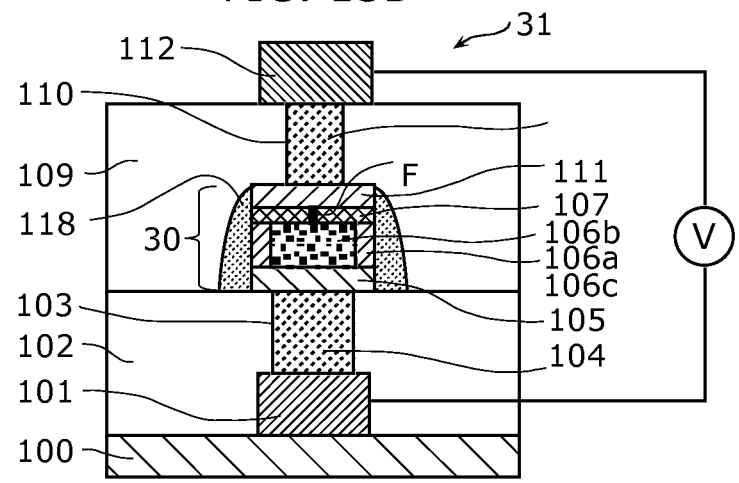
FIG. 13D is a cross-sectional view illustrating the method for manufacturing principal parts of the nonvolatile memory device according to Embodiment 2 of the present invention.

As illustrated in FIG. 13B, the side wall protecting layer 108 is etched by anisotropic dry etching to provide the side wall protecting layer 118 that is side wall-like only to the side wall portions of the first electrode 105, the variable resistance layer 106, and the second electrode 107. Next, as illustrated in FIG. 13C, the second interlayer insulating layer 109 having a thickness of 500 to 1000 nm is formed to cover the variable resistance layer 106, the second contact hole 110 and the second contact plug 111 are formed by the same manufacturing method as in FIG. 2A and FIG. 2B, and the second line 112 is formed to cover the second contact plug 111. Subsequently, as illustrated in FIG. 13D, the localized region F of which an oxygen deficiency reversibly changes in response to an application of electrical pulses is formed in the second variable resistance layer 10 by the above-mentioned initial breakdown process, and a nonvolatile memory device 31 is completed. The localized region presumably includes a filament including an oxygen defect site.

It is to be noted that to produce an effect of suppressing a deterioration and a fluctuation in the resistance change characteristics of the nonvolatile memory element 30, it is important to cut off oxygen supply to the third metal oxide 106c by covering at least the sides of the third metal oxide 106c with the side wall protecting layer 118 in FIG. 13B, and the sides of the second metal oxide 106b or the sides of the first electrode 105 and the second electrode 107 may not necessarily be covered with the side wall protecting layer 118. This is because, since the second metal oxide 106b is practically an insulator, and the first electrode 105 and the second electrode 107 are relatively difficult to oxidize, even if they are not covered with the side wall protecting layer 118, the fluctuation in the characteristics of the nonvolatile memory element is not presumably easily increased by the further process of oxidation. This applies not only to the nonvolatile memory element 30 but also to the nonvolatile memory elements 20 and 24 respectively described in Embodiment 1 and the modification thereof.

Moreover, the effect of reducing the initial breakdown voltage and the effect of suppressing the fluctuation in the characteristics of the nonvolatile memory element that are described above are independent of each other. The side wall protecting layer 118 does not always cover the sides of the third metal oxide 106c provided to reduce the initial breakdown voltage, and if there is a layer in which the characteristics of a nonvolatile memory element fluctuate due to the process of oxidation, it is possible to suppress the fluctuation in the characteristics of the nonvolatile memory element by covering the sides of the layer with the side wall protecting layer 118. Thus, the effect of suppressing the fluctuation in the characteristics of the nonvolatile memory element by the covering with the side wall protecting layer 118 can be produced even in a nonvolatile memory element requiring no initial breakdown process.

(First Application Example of Nonvolatile Memory Element)

The nonvolatile memory elements according to Embodiment 1 and Embodiment 2 described above can be applied to various forms of nonvolatile memory devices. There is a so-called cross point nonvolatile memory device in which nonvolatile memory elements (active layers) are provided at cross points (three-dimensional cross points) of word lines and bit lines, as the first application example of the nonvolatile memory element according to this embodiment. The following describes this example.

[Configuration of Nonvolatile Memory Device in First Application Example]

Figure 14:
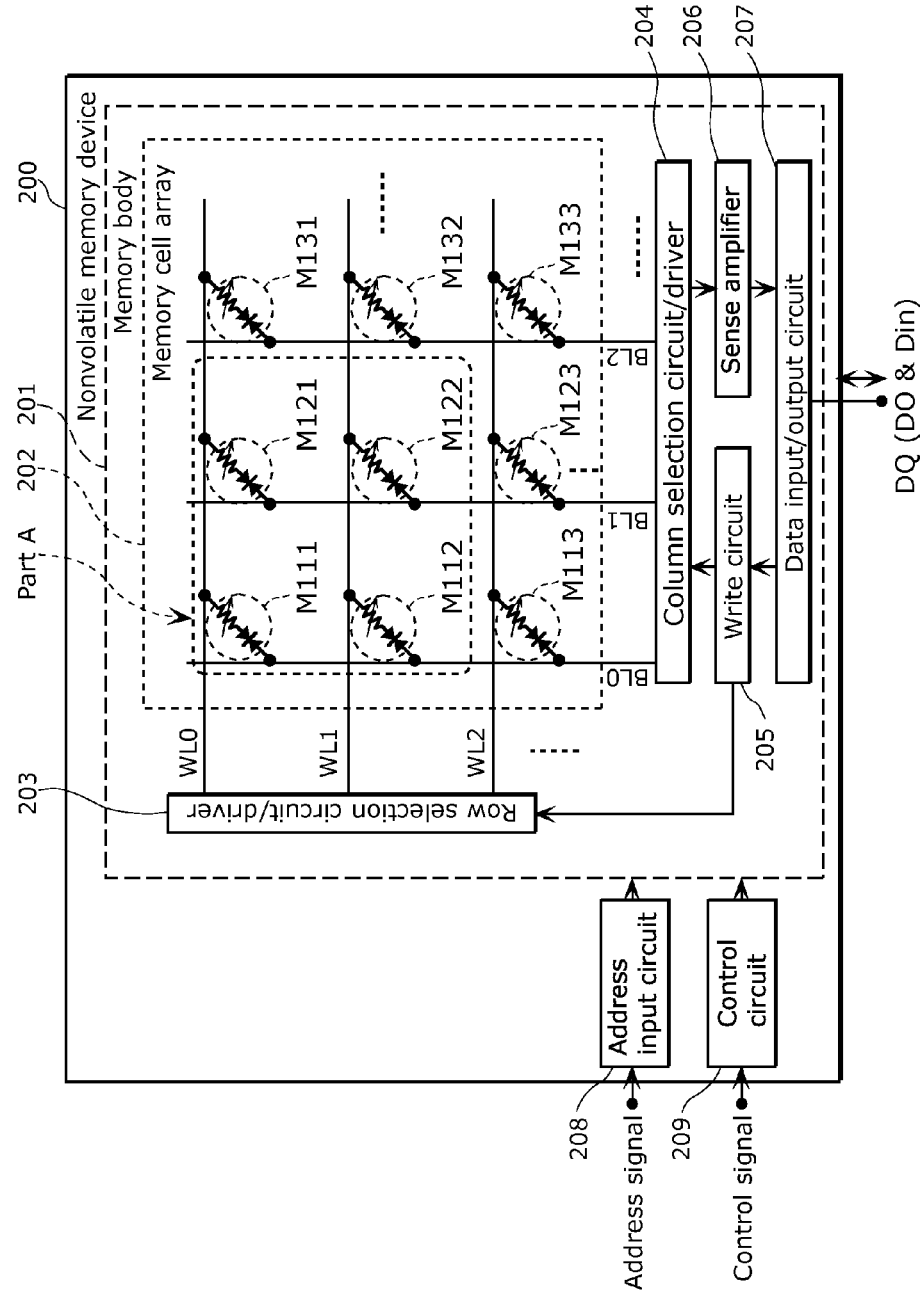
FIG. 14 is a block diagram illustrating a configuration of a nonvolatile memory device to which the nonvolatile memory element according to Embodiment 1 of the present invention is applied.

FIG. 14 is a block diagram illustrating a configuration of a nonvolatile memory device in the first application example to which the nonvolatile memory element according to Embodiment 1 or Embodiment 2 of the present invention is applied. Moreover, FIG. 15 is a perspective view illustrating a structure of Part A (four-bit structure) in the nonvolatile memory device illustrated in FIG. 14.

As illustrated in FIG. 14, a nonvolatile memory device 200 according to this example includes, on a semiconductor substrate, a memory body 201 that includes: a memory cell array 202; a row selection circuit/driver 203; a column selection circuit/driver 204; a write circuit 205 for writing data; a sense amplifier 206 that detects an amount of current flowing to a selected bit line and determines whether data is "1" or "0"; and a data input/output circuit 207 that executes input and output processing of input and output data via a terminal DQ. Moreover, the nonvolatile memory device 200 further includes: an address input circuit 208 that receives an address signal from outside; and a control circuit 209 that controls the operations of the memory body 201 based on a control signal received from outside.

Figure 15:
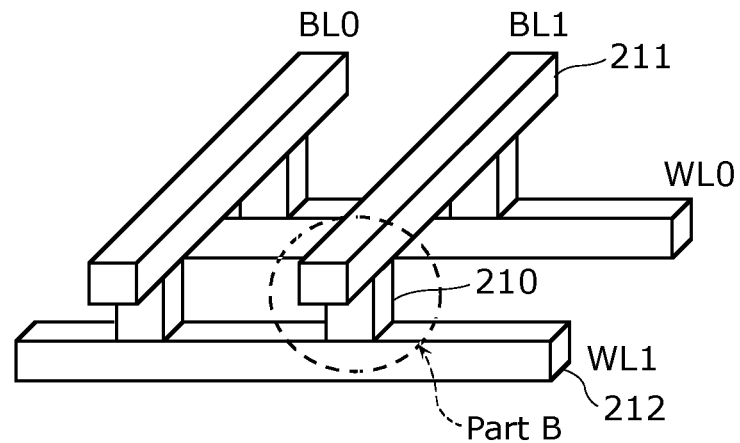
FIG. 15 is a perspective view illustrating a structure of Part A (four-bit structure) in the nonvolatile memory device illustrated in FIG. 14.

As illustrated in FIG. 14 and FIG. 15, the memory cell array 202 includes: word lines (first lines) WL0, WL1, WL2, . . . formed on the semiconductor substrate to be parallel to each other; and bit lines (second lines) BL0, BL1, BL2, . . . formed in a plane parallel to the principle surface of the semiconductor substrate to be parallel to each other and above the word lines WL0, WL1, WL2, . . . , to three-dimensionally cross the word lines WL0, WL1, WL2, . . . .

Moreover, the memory cell array 202 is provided with memory cells M111, M112, M113, M121, M122, M123, M131, M132, M133, . . . (hereinafter referred to as "memory cells M111, M112, . . . ") disposed in a matrix at respective three-dimensional cross points of these word lines WL0, WL1, WL2, . . . and these bit lines BL0, BL1, BL2, . . . .

Here, each of the memory cells M111, M112, . . . includes one of the nonvolatile memory element 20 according to Embodiment 1 and the nonvolatile memory element 30 according to Embodiment 2, and a current steering element connected in series with the one of the nonvolatile memory element 20 and the nonvolatile memory element 30. The nonvolatile memory element of each of the memory cells M111, M112, . . . includes the variable resistance layer comprising the oxygen-deficient metal oxide having a laminated structure.

It is to be noted that the memory cells M111, M112, . . . in FIG. 14 are each denoted by reference sign 210 in FIG. 15.

Here, an initial breakdown operation may be performed by a tester at a time of an initial test, or the write circuit 205 may generate an initial breakdown voltage.

[Structure of Nonvolatile Memory Element in Nonvolatile Memory Device in First Application Example]

Figure 16:
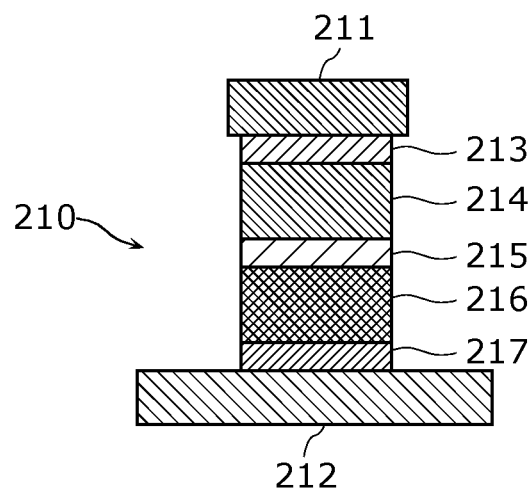
FIG. 16 is a cross-sectional view illustrating a structure of a nonvolatile memory element in the first application example of the nonvolatile memory device illustrated in FIG. 14.

FIG. 16 is a cross-sectional view illustrating a structure of a nonvolatile memory element in the first application example of the nonvolatile memory device illustrated in FIG. 14. It is to be noted that FIG. 16 illustrates a structure of Part B in FIG. 15.

As illustrated in FIG. 16, in the nonvolatile memory device according to this example, a nonvolatile memory element 210 is between a lower line 212 (corresponding to the word line WL1 in FIG. 15) that is a copper line, and an upper line 211 (corresponding to the bit line BL1 in FIG. 15), and includes, as stacked layers, a lower electrode 217, a current steering layer 216, an inner electrode 215, a variable resistance layer 214, and an upper electrode 213 in this order.

Here, the inner electrode 215, the variable resistance layer 214, and the upper electrode 213 correspond to the first electrode 105, the variable resistance layer 106, and the second electrode 107 in the nonvolatile memory element 20 according to Embodiment 1 illustrated in FIG. 1, respectively. Thus, the structure in this example is formed in the same manner as the structure in Embodiment 1.

Here, a nonvolatile memory element capable of stabilizing a resistance change operation can be formed by covering the side walls of the variable resistance layer 106 with the side wall protecting layer 108 or the side wall protecting layer 118.

The current steering element 216 is connected in series with the variable resistance layer 214 via the inner electrode 215 comprising TaN, and the current steering layer 216 and the variable resistance layer 214 are electrically connected with each other. The current steering element including the lower electrode 217, the current steering layer 216, and the inner electrode 215 is an element that is represented by a metal-insulator-metal (MIM) diode or a metal-semiconductor-metal (MSM) diode and has nonlinear current characteristics for voltage. The MSM diode is capable of conducting more current. Amorphous Si or the like can be used as the current steering layer 216. Moreover, the current steering element has bidirectional current characteristics for voltage, and becomes conductive with at least first threshold voltage Vf1 or at most second threshold voltage Vf2 (where Vf1>Vf2).

It is to be noted that tantalum and an oxide thereof are a material commonly used for the semiconductor process, and are said to have a significantly high affinity. For this reason, it is possible to easily incorporate the tantalum and the oxide thereof into an existing semiconductor manufacturing process.

[Exemplary Structure of Nonvolatile Memory Device Having Multi-layered Structure]

It is possible to realize a nonvolatile memory device having a multi-layered structure, by three-dimensionally stacking a plurality of the memory cell arrays in the nonvolatile memory device according to this example illustrated in FIG. 14 and FIG. 15.

Figure 17:
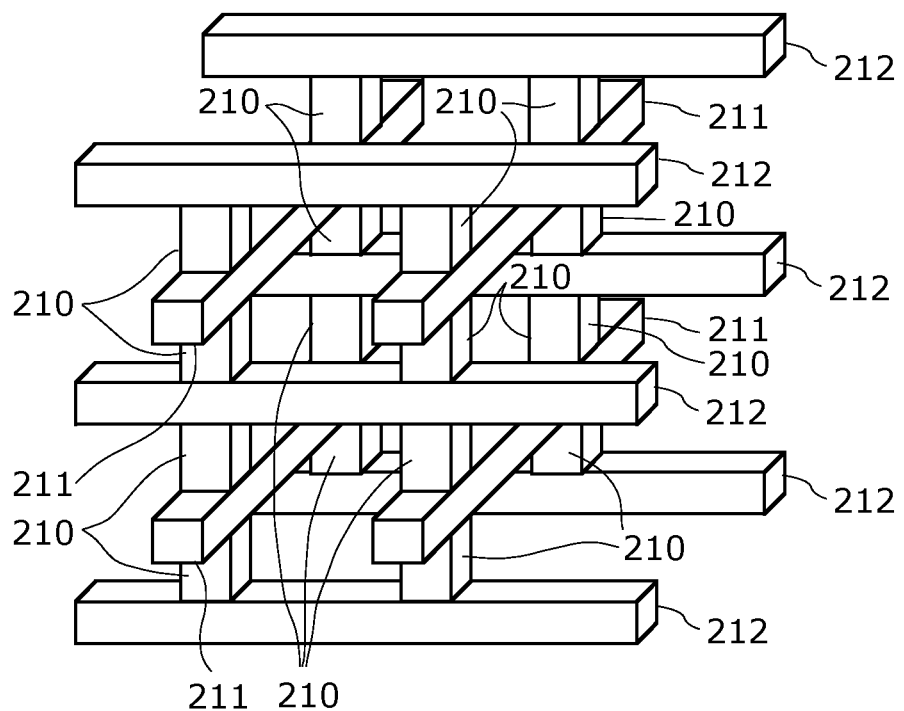
FIG. 17 is a perspective view illustrating a structure of memory cell arrays obtained by multi-layering the first application example of the nonvolatile memory device illustrated in FIG. 14.

FIG. 17 is a perspective view illustrating a structure of memory cell arrays obtained by multi-layering the first application example of the nonvolatile memory device illustrated in FIG. 15. As illustrated in FIG. 17, this nonvolatile memory device includes a multi-layered memory cell array obtained by stacking memory cell arrays each of which includes: lower lines (first lines) 212 formed on a semiconductor substrate not shown to be parallel to each other; upper lines (second lines) 211 in a plane parallel to the principle surface of the substrate to be parallel to each other and above the lower lines 212 to three-dimensionally cross the lower lines 212; and memory cells 210 disposed in a matrix at respective three-dimensional cross points of these lower lines 212 and these upper lines 211.

It is to be noted that although the structure includes five wiring layers and four layers of the nonvolatile memory elements at the respective three-dimensional cross points in an example illustrated in FIG. 17, it goes without saying that the numbers of the layers can be increased or decreased as necessary.

Providing the multi-layered memory cell array thus structured makes it possible to realize an ultra large-capacity nonvolatile memory.

It is to be noted that as described in Embodiment 1, the variable resistance layer in the present invention can be formed at low temperature. Thus, since a transistor formed in a lower layer step and a wiring material such as silicide are unaffected even if stacking is performed in a wiring step as shown in this embodiment, it is possible to easily realize the multi-layered memory cell array. In other words, it is possible to easily realize the nonvolatile memory device having the multi-layered structure, by using the variable resistance layer comprising the tantalum oxide of the present invention.

(Second Application Example of Nonvolatile Memory Element)

There is a nonvolatile memory device having a structure of 1 transistor-1 nonvolatile memory element (1T1R structure), as the second application example of the nonvolatile memory element according to this embodiment.

[Configuration of Nonvolatile Memory Device in Second Application Example]

Figure 18:
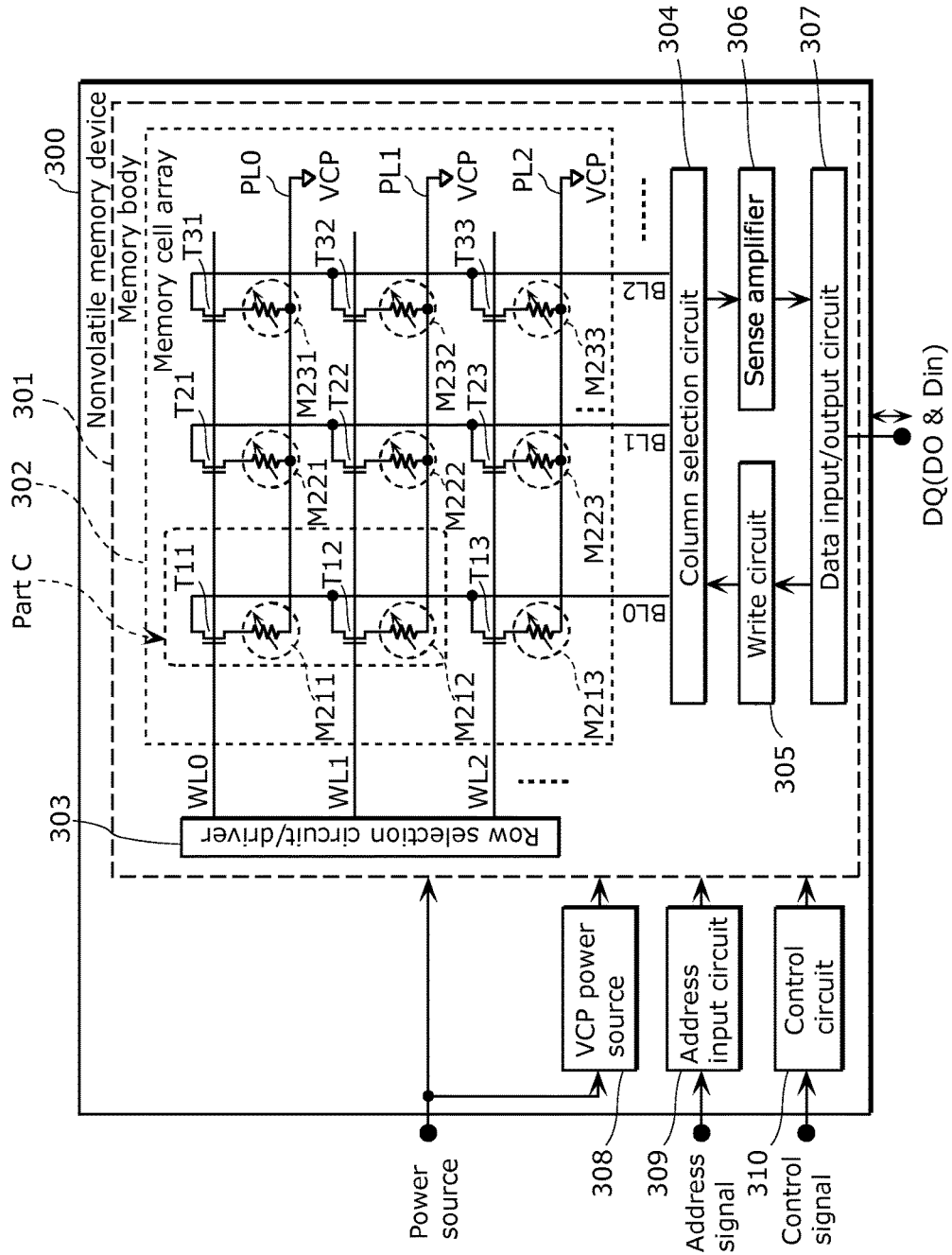
FIG. 18 is a block diagram illustrating a configuration of a nonvolatile memory device in the second application example to which the nonvolatile memory element according to Embodiment 1 of the present invention is applied.
Figure 19:
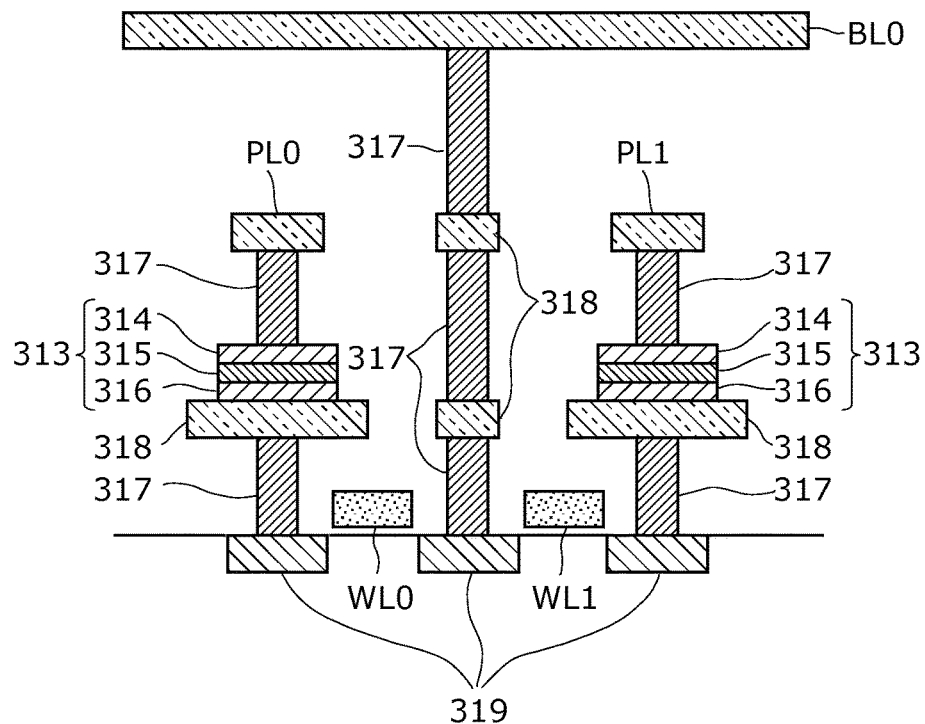
FIG. 19 is a cross-sectional view illustrating a structure of Part C (two-bit structure) in the nonvolatile memory device illustrated in FIG. 18.

FIG. 18 is a block diagram illustrating a configuration of a nonvolatile memory device in the second application example to which the nonvolatile memory element according to Embodiment 1 or Embodiment 2 of the present invention is applied. Moreover, FIG. 19 is a perspective view illustrating a structure of Part C (two-bit structure) in the nonvolatile memory device illustrated in FIG. 18.

As illustrated in FIG. 18, a nonvolatile memory device 300 according to this example includes, on a semiconductor substrate, a memory body 301 that includes: a memory cell array 302; a row selection circuit/driver 303; a column selection circuit 304; a write circuit 305 for writing data; a sense amplifier 306 that detects an amount of current flowing to a selected bit line and determines whether data is "1" or "0"; and a data input/output circuit 307 that executes input and output processing of input and output data via a terminal DQ. Moreover, the nonvolatile memory device 300 further includes: a cell plate power source (VCP power source) 308; an address input circuit 309 that receives an address signal from outside; and a control circuit 310 that controls the operations of the memory body 301 based on a control signal received from outside.

The memory cell array 302 includes: word lines (first lines) WL0, WL1, WL2, . . . and bit lines (second lines) BL0, BL1, BL2, . . . formed on the semiconductor substrate and arranged to cross each other; transistors T11, T12, T13, T21, T22, T23, T31, T32, T33, . . . (hereinafter referred to as "transistors T11, T12, . . . ") disposed at respective cross points of these word lines WL0, WL1, WL2, . . . and these bit lines BL0, BL1, BL2, . . . ; and memory cells M211, M212, M213, M221, M222, M223, M231, M232, M233, . . . (hereinafter referred to as "memory cells M211, M212, . . . ") disposed one-to-one to the transistors T11, T12, . . . .

Moreover, the memory cell array 302 includes plate lines (third lines) PL0, PL1, PL2, . . . arranged in parallel to the word lines WL0, WL1, WL2, . . . . As illustrated in FIG. 19, the bit line BL0 is disposed above the word lines WL0 and WL1, and the plate lines PL0 and PL1 are disposed between the word lines WL0 and WL1 and the bit line BL0. It is to be noted that the plate lines are disposed in parallel to the word lines in the above exemplary structure, the plate lines may be disposed in parallel to the bit lines. Moreover, although the transistors are subjected to a common electric potential through the plate lines, the nonvolatile memory device 300 may include a plate line selection circuit/driver having the same configuration as the row selection circuit/driver, and a selected plate line and a non-selected plate line may be driven by different voltages (having different polarities).

Here, each of the memory cells M211, M212, . . . corresponds to the nonvolatile memory element 20 according to Embodiment 1 or the nonvolatile memory element 30 according to Embodiment 2. The nonvolatile memory element of each of the memory cells M211, M212, . . . includes the variable resistance layer comprising the oxygen-deficient metal oxide having a laminated structure. More specifically, the nonvolatile memory element 313 in FIG. 19 corresponds to each of the memory cells M211, M212, . . . in FIG. 18, and includes an upper electrode 314, a variable resistance layer 315 comprising an oxygen-deficient metal oxide and having a stack structure, and a lower electrode 316.

It is to be noted that FIG. 19 illustrates a plug layer 317, a metal wiring layer 318, and a source or drain region 319.

As illustrated in FIG. 18, each of the transistors T11, T12, T13, . . . has a drain connected to the bit line BL0, each of the transistors T21, T22, T23, . . . has a drain connected to the bit line BL1, and each of the transistors T31, T32, T33, . . . has a drain connected to the bit line BL2.

Moreover, each of the transistors T11, T21, T31, . . . has a gate connected to the word line WL0, each of the transistors T12, T22, T32, . . . has a gate connected to the word line WL1, and each of the transistors T13, T23, T33, . . . has a gate connected to the word line WL2.

Furthermore, the transistors T11, T12, . . . have sources connected to the respective memory cells M211, M212, . . . .

Moreover, the memory cells M211, M221, M231, . . . , the memory cells M212, M222, M232, . . . , and the memory cells M213, M223, M233, . . . are connected to the plate line PL0, the plate line PL1, and the plate line PL2, respectively.

The address input circuit 309 receives address signals from an external circuit (not shown) and outputs row address signals and column address signals to the row selection circuit/driver 303 and the column selection circuit 304, respectively, based on such address signals. Here, the address signals are signals which indicate an address of a particular memory cell selected from among the plurality of memory cells M211, M212, . . . . The row address signals are signals which indicate an address of a row among addresses indicated in the address signals, and the column address signals are signals which indicate an address of a column among the addresses indicated in the address signals.

The control circuit 310 outputs, to the write circuit 305, a write signal with which application of a write voltage is instructed, according to input data Din received by the data input/output circuit 307, in a cycle of writing information.

On the other hand, in a cycle of reading information, the control circuit 310 outputs, to the column selection circuit 304, a read signal with which application of a read voltage is instructed.

The row selection circuit/driver 303 receives the row address signals from the address input circuit 309, selects one of the plurality of word lines WL0, WL1, WL2, . . . according to these row address signals, and applies a predetermined voltage to the selected word line.

The column selection circuit 304 receives the column address signals from the address input circuit 309, selects one of the plurality of bit lines BL0, BL1, BL2, . . . according to these column address signals, and applies a write voltage or a read voltage to the selected bit line.

When the write circuit 305 receives a write signal from the control circuit 310, the write circuit 305 outputs, to the column selection circuit 304, a signal with which application of a write voltage to the selected bit line is instructed.

The sense amplifier 306 detects an amount of current flowing to the selected bit line to be read and determines whether data is "1" or "0", in the cycle of reading information. The resulting output data DO is output to an external circuit via the data input/output circuit 307.

Here, an initial breakdown operation may be performed by a tester at a time of an initial test, or the write circuit 305 may generate an initial breakdown voltage.

It is to be noted that this application example having the structure of 1 transistor-1 nonvolatile memory element is smaller in storage capacity than the structure of the cross point nonvolatile memory element in the first application example. This application example, however, has advantages of being easily incorporated into CMOS process and allowing control of operations with ease, since the application example does not require the current steering element such as the diode.

Moreover, as with the first application example, since the variable resistance layer in the present invention can be formed at the low temperature, there is an advantage that the transistor formed in the lower layer step and the wiring material such as silicide are unaffected even if the stacking is performed in the wiring step as shown in this application example.

Furthermore, as with the first application example, since the formation of tantalum and the oxide thereof can be easily incorporated into the existing semiconductor manufacturing process, the nonvolatile memory device in this application example can be easily manufactured.

It is to be noted that although the cases where the metal oxide as the variable resistance layer is the tantalum oxide, the hafnium oxide, or the zirconium oxide are described in the above-mentioned embodiments, a metal oxide between the first electrode and the second electrode may include, as a variable resistance layer in which a resistance change occurs, an oxide of tantalum, hafnium, zirconium, or the like, and may include a slight amount of a chemical element other than those. It is also possible to intentionally include a small amount of the other chemical element by slightly adjusting a resistance value or the like, and such a case is also included in the scope of the present invention. For instance, adding nitrogen to a variable resistance layer increases the resistance value of the variable resistance layer, which enhances the reactivity of resistance change.

Moreover, although a slight amount of a chemical element may be mixed into a variable resistance layer due to residual gas or gas released from a vacuum chamber wall when the variable resistance layer is formed by sputtering, it goes without saying that the case where such a slight amount of the chemical element is mixed into a resistance film is included in the scope of the present invention.

Although the nonvolatile memory element, the nonvolatile memory device, and the methods for manufacturing these according to one or more aspects of the present invention are described above based on the embodiments, the present invention is not limited to the embodiments. Those skilled in the art will readily appreciate that various modifications may be made in the embodiments and that other embodiments may be obtained by combining the structural elements in the different embodiments, without departing from the spirit of the present invention. Accordingly, all such modifications and embodiments may be included in the scope of the one or more aspects.

INDUSTRIAL APPLICABILITY

The present invention provides a variable resistance semiconductor memory element and a nonvolatile memory device including the variable resistance semiconductor memory element and realizes a nonvolatile memory that operates stably and has high reliability, and is thus useful for various electronic devices using the nonvolatile memory.

REFERENCE SIGNS LIST 10, 20, 24, 30 Nonvolatile memory element
11, 12, 21, 22, 25, 31 Nonvolatile memory device
100 Substrate
101 First line
102 First interlayer insulating layer
103 First contact hole
104 First contact plug
105 First electrode
106, 117 Variable resistance layer
1061, 1161 First variable resistance layer
1062 Second variable resistance layer
106a First metal oxide
106a1 First region
106a2 Second region
106b Second metal oxide
106c Third metal oxide
107 Second electrode
108, 118 Side wall protecting layer
109 Second interlayer insulating layer
110 Second contact hole
111 Second contact plug
112 Second line
113 Third interlayer insulating layer
114 Third contact hole
115 Third contact plug
116 Third line
200 Nonvolatile memory device
201 Memory body
202 Memory cell array
203 Row selection circuit/driver
204 Column selection circuit/driver
205 Write circuit
206 Sense amplifier
207 Data input/output circuit
208 Address input circuit
209 Control circuit
210 Nonvolatile memory element
211 Upper line
212 Lower line
213 Upper electrode
214 Variable resistance layer
215 Inner electrode
216 Current steering layer
217 Lower electrode
218 Ohmic resistance layer
219 Second variable resistance layer
300 Nonvolatile memory device
301 Memory body
302 Memory cell array
303 Row selection circuit/driver
304 Column selection circuit
305 Write circuit
306 Sense amplifier
307 Data input/output circuit
308 Cell plate power source
309 Address input circuit
310 Control circuit
313 Nonvolatile memory element
314 Upper electrode
315 Variable resistance layer
316 Lower electrode
BL0, BL1, . . . Bit line
M11, M12, . . . Memory cell
T11, T12, . . . Transistor
WL0, WL1, . . . Word line

The invention claimed is:

1. A nonvolatile memory element comprising:
a first electrode;
a second electrode;
a variable resistance layer that is between the first electrode and the second electrode and includes, as stacked layers, a first variable resistance layer connected to the first electrode and a second variable resistance layer connected to the second electrode, the variable resistance layer having a resistance value that reversibly changes based on an electrical signal applied between the first electrode and the second electrode;
a side wall protecting layer that has oxygen barrier properties and covers at least a side surface of the variable resistance layer and a side surface of the first electrode; and
an interlayer insulating layer formed to cover at least the side wall protecting layer,
wherein the first variable resistance layer comprises a first transition metal oxide and a third transition metal oxide formed around the first transition metal oxide and having an oxygen deficiency lower than an oxygen deficiency of the first transition metal oxide, and the second variable resistance layer comprises a second transition metal oxide having an oxygen deficiency lower than the oxygen deficiency of the first transition metal oxide,
wherein the second variable resistance layer comprises a first side and a second side,
wherein the first side of the second variable resistance layer is in physical contact with the second electrode, and
wherein the second side of the second variable resistance layer is in physical contact with the first transition metal oxide and the third transition metal oxide.

2. The nonvolatile memory element according to claim 1, wherein the side wall protecting layer comprises one of a metal oxide, a metal nitride, and a metal acid nitride that have insulation properties and oxygen barrier properties.

3. The nonvolatile memory element according to claim 1, wherein the side wall protecting layer comprises one of a silicon nitride, an aluminum oxide, and a titanium oxide.

4. The nonvolatile memory element according to claim 1, wherein the first transition metal oxide has a stack structure of a plurality of layers comprising metal oxides having different oxygen deficiencies.

5. The nonvolatile memory element according to claim 1, wherein each of the first transition metal oxide, the second transition metal oxide, and the third transition metal oxide is one of a tantalum oxide, a hafnium oxide, and a zirconium oxide.

6. The nonvolatile memory element according to claim 1, wherein the second variable resistance layer is provided with a localized region having an oxygen deficiency, the localized region configured to reversibly change the oxygen deficiency in response to an application of an electric pulse.

7. The nonvolatile memory element according to claim 1, wherein the side wall protecting layer further covers at least a side surface of the second transition metal.

8. The nonvolatile memory element according to claim 1, wherein the side wall protecting layer further covers at least a side surface of the second electrode.

9. The nonvolatile memory element according to claim 8, wherein the side wall protecting layer further covers at least a top surface of the second electrode.

* * * * *